(12) United States Patent
Xie et al.

(10) Patent No.: US 9,779,960 B2
(45) Date of Patent: Oct. 3, 2017

(54) HYBRID FIN CUTTING PROCESSES FOR FINFET SEMICONDUCTOR DEVICES

(71) Applicant: GLOBALFOUNDRIES Inc., Grand Cayman (KY)

(72) Inventors: Ruilong Xie, Niskayuna, NY (US); Min Gyu Sung, Latham, NY (US); Catherine B. Labelle, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/726,712

(22) Filed: Jun. 1, 2015

(65) Prior Publication Data

US 2016/0351411 A1 Dec. 1, 2016

(51) Int. Cl.

| H01L 21/311 | (2006.01) |
|---|---|
| B23P 15/00 | (2006.01) |
| C03C 25/00 | (2006.01) |
| C23F 1/00 | (2006.01) |
| H01L 21/308 | (2006.01) |

(52) U.S. Cl.
CPC ...... H01L 21/3086 (2013.01); H01L 21/3083 (2013.01)

(58) Field of Classification Search
CPC .. H01L 21/311; H05K 3/007; H05K 2203/06; H05K 2203/1131

USPC .......................................................... 438/696
See application file for complete search history.

(56) References Cited

U.S. PATENT DOCUMENTS

| 2012/0244711 A1* | 9/2012 | Yin | H01L 21/0337 438/703 |
|---|---|---|---|
| 2015/0263097 A1* | 9/2015 | Cheng | H01L 29/165 257/192 |
| 2015/0318180 A1* | 11/2015 | Rim | H01L 21/3085 257/347 |
| 2015/0380438 A1* | 12/2015 | Chudzik | H01L 27/1207 257/350 |
| 2016/0035872 A1* | 2/2016 | Loubet | H01L 29/785 257/347 |
| 2016/0148998 A1* | 5/2016 | Wu | H01L 29/0649 257/369 |

* cited by examiner

*Primary Examiner* — Thomas Pham
(74) *Attorney, Agent, or Firm* — Amerson Law Firm, PLLC

(57) ABSTRACT

One illustrative method disclosed herein includes, among other things, forming a fin-removal masking layer comprised of a plurality of line-type features, each of which is positioned above one of the fins, and a masking material positioned at least between adjacent features of the fin-removal masking layer and above portions of an insulating material in the trenches between the fins. The method also includes performing an anisotropic etching process through the fin-removal masking layer to remove the portions of the fins to be removed.

28 Claims, 24 Drawing Sheets

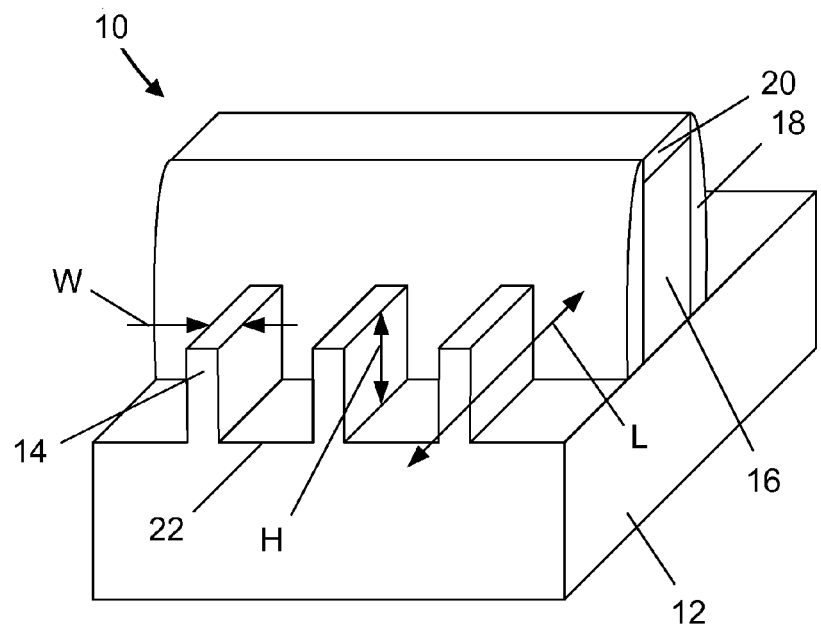
Figure 1A (Prior Art)
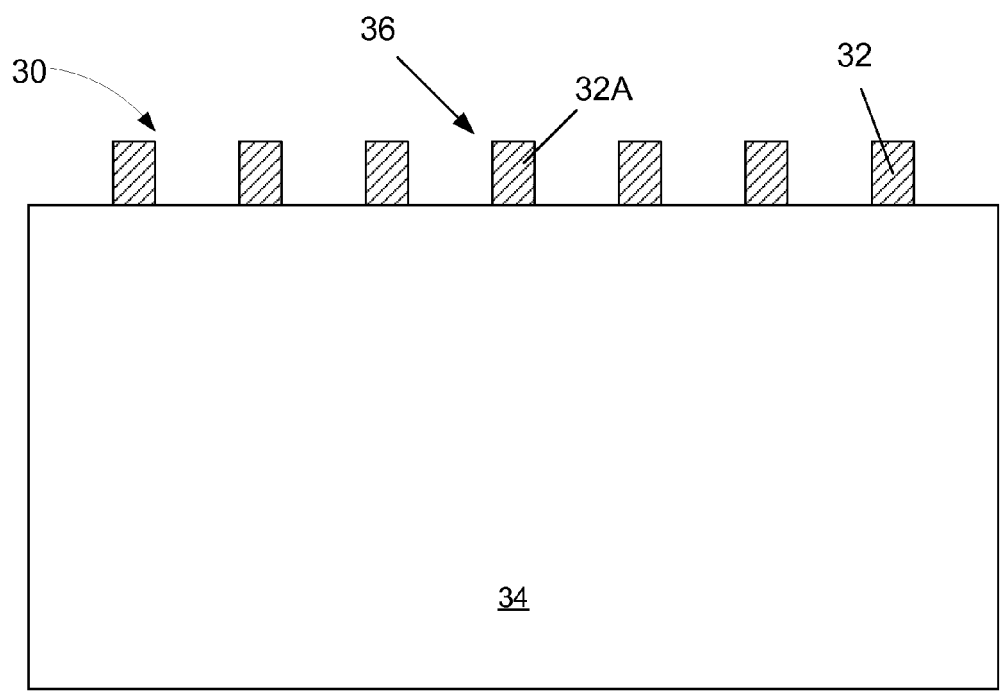
(Prior Art) Figure 1B

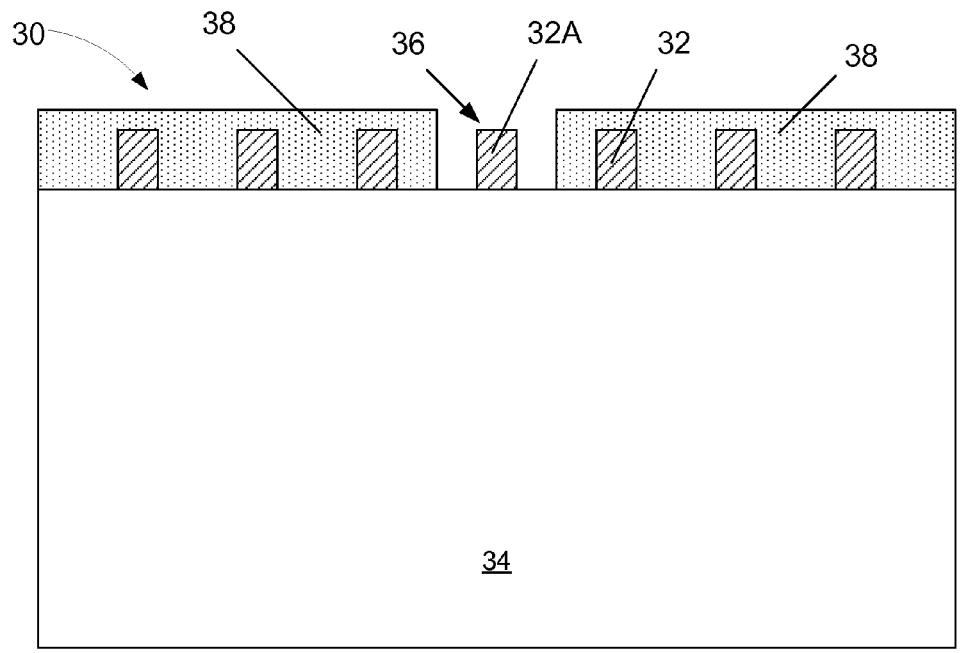
(Prior Art) Figure 1C
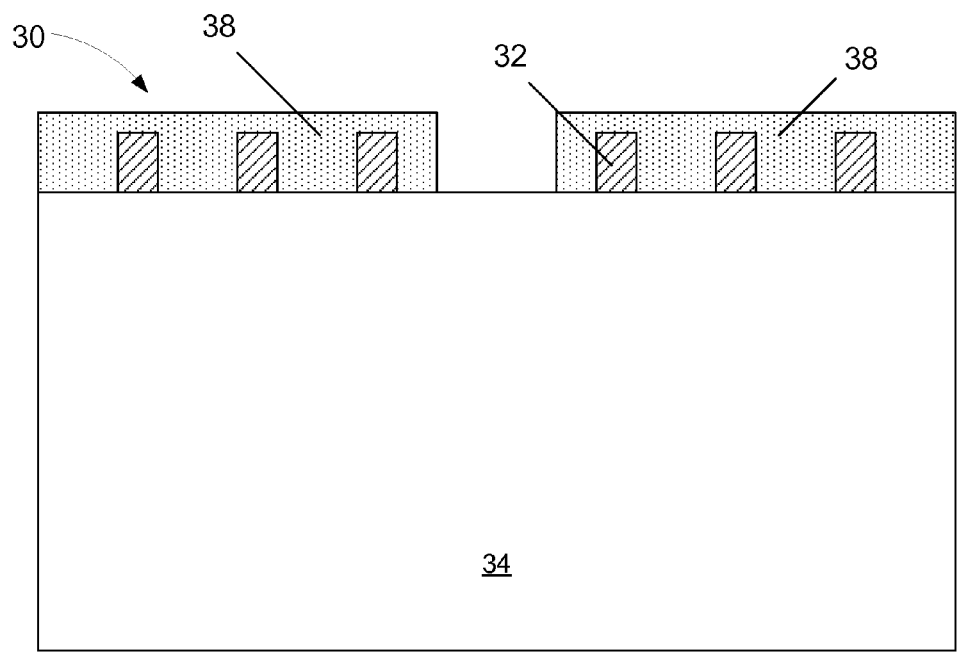
(Prior Art) Figure 1D

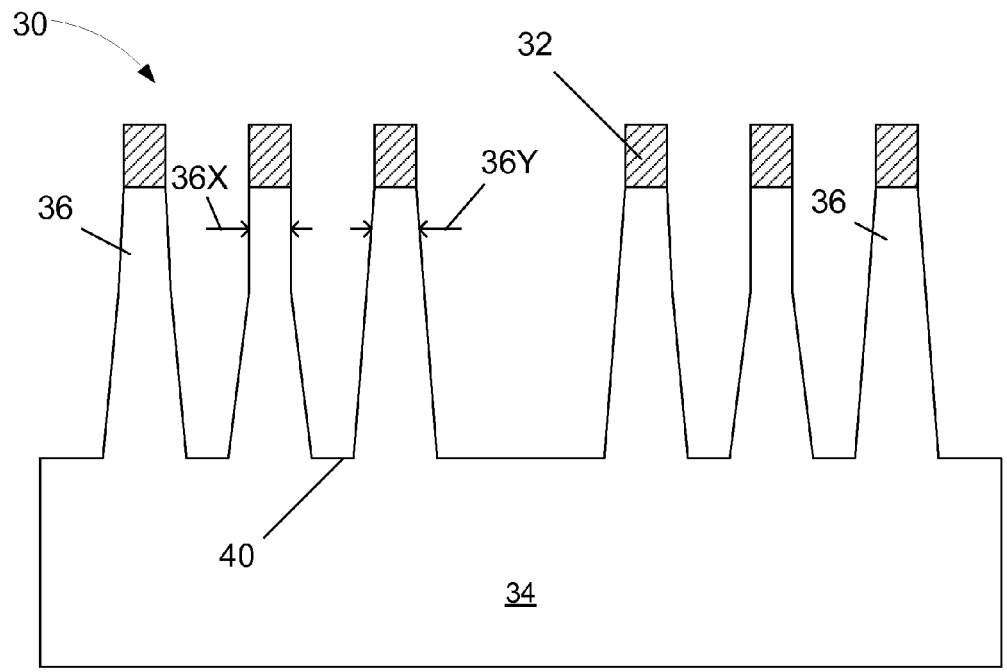
(Prior Art) Figure 1E
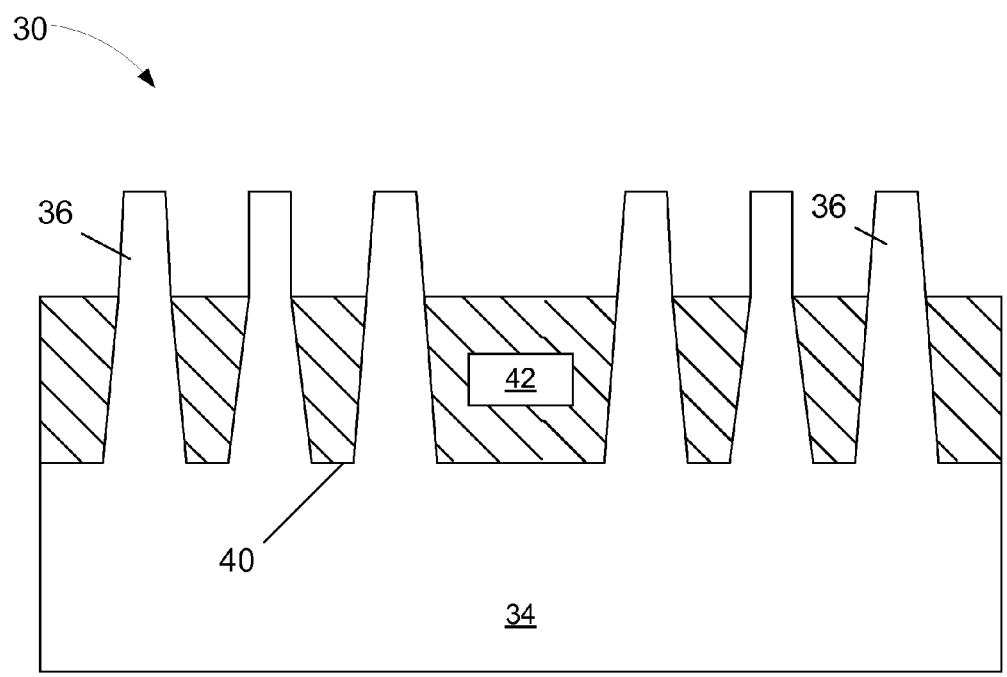
(Prior Art) Figure 1F

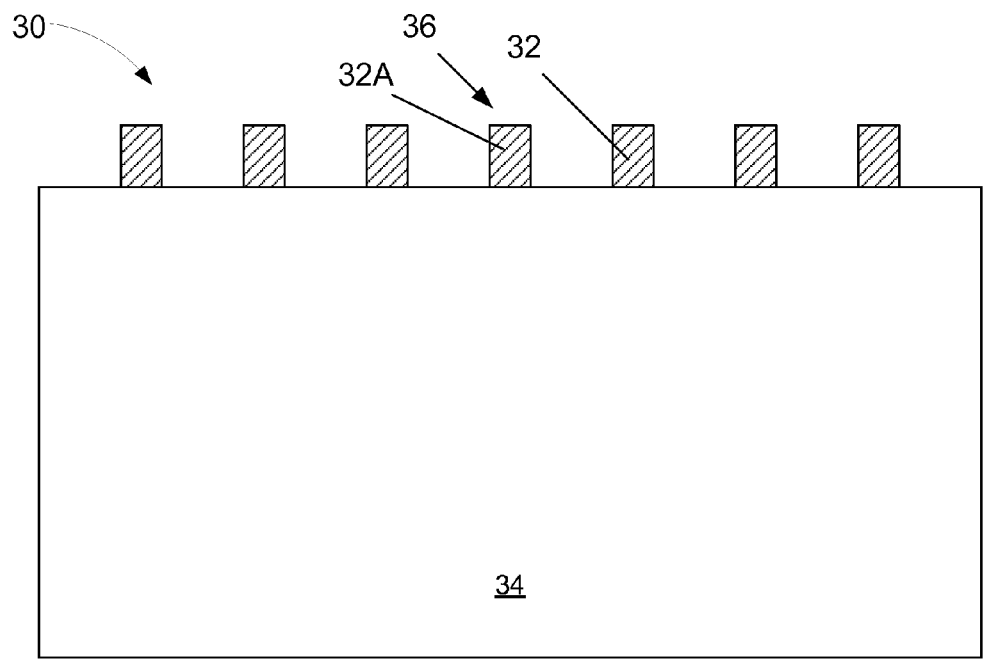
(Prior Art) Figure 1G
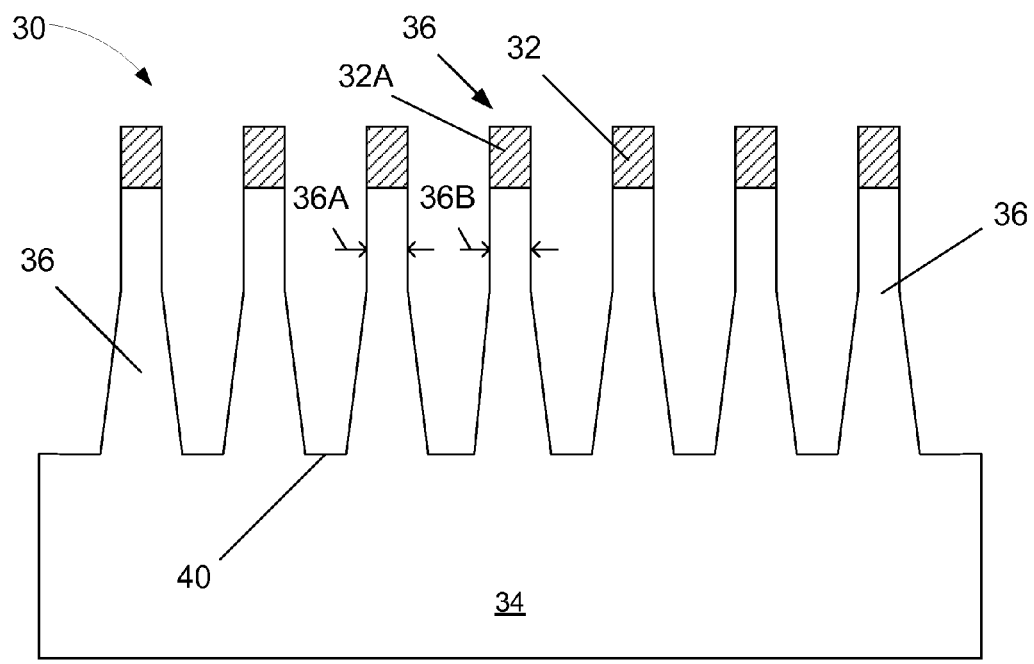
(Prior Art) Figure 1H

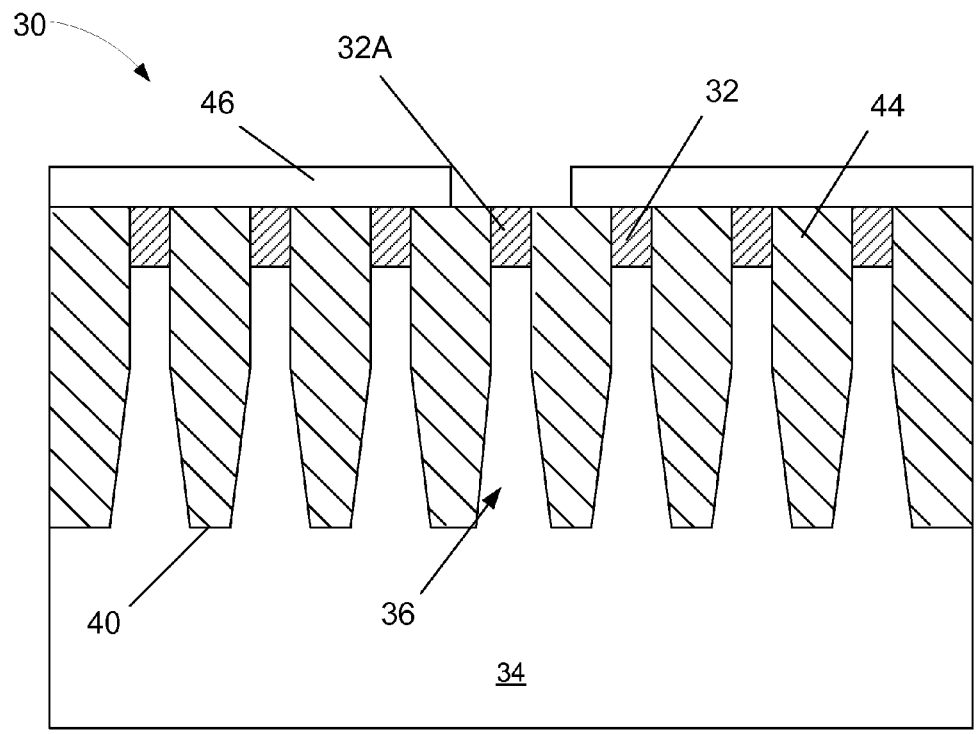
(Prior Art) Figure 1I
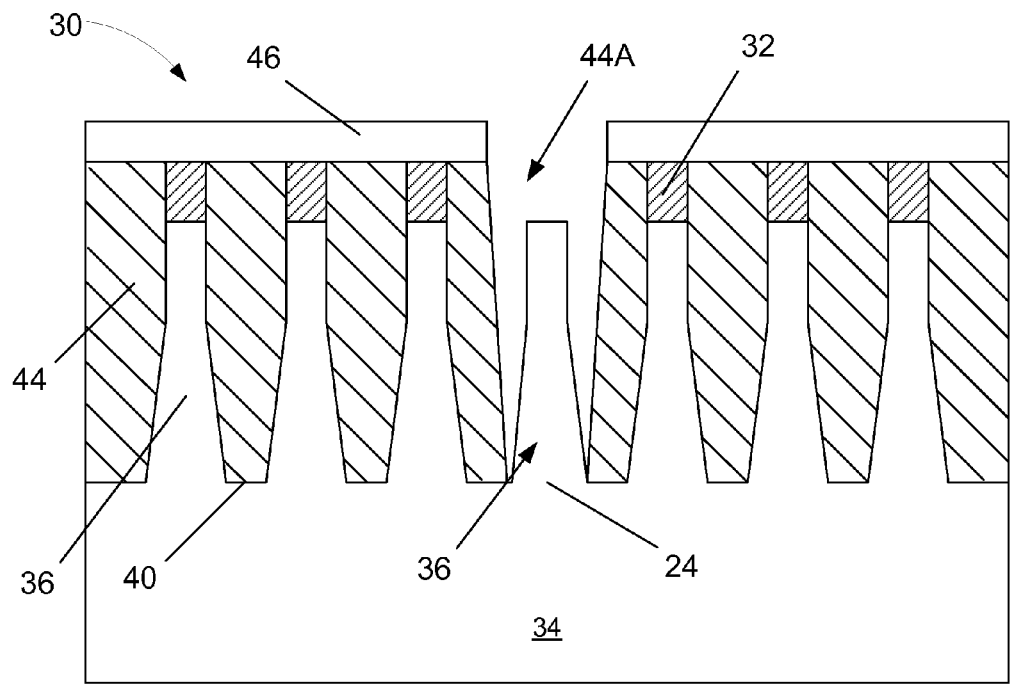
(Prior Art) Figure 1J

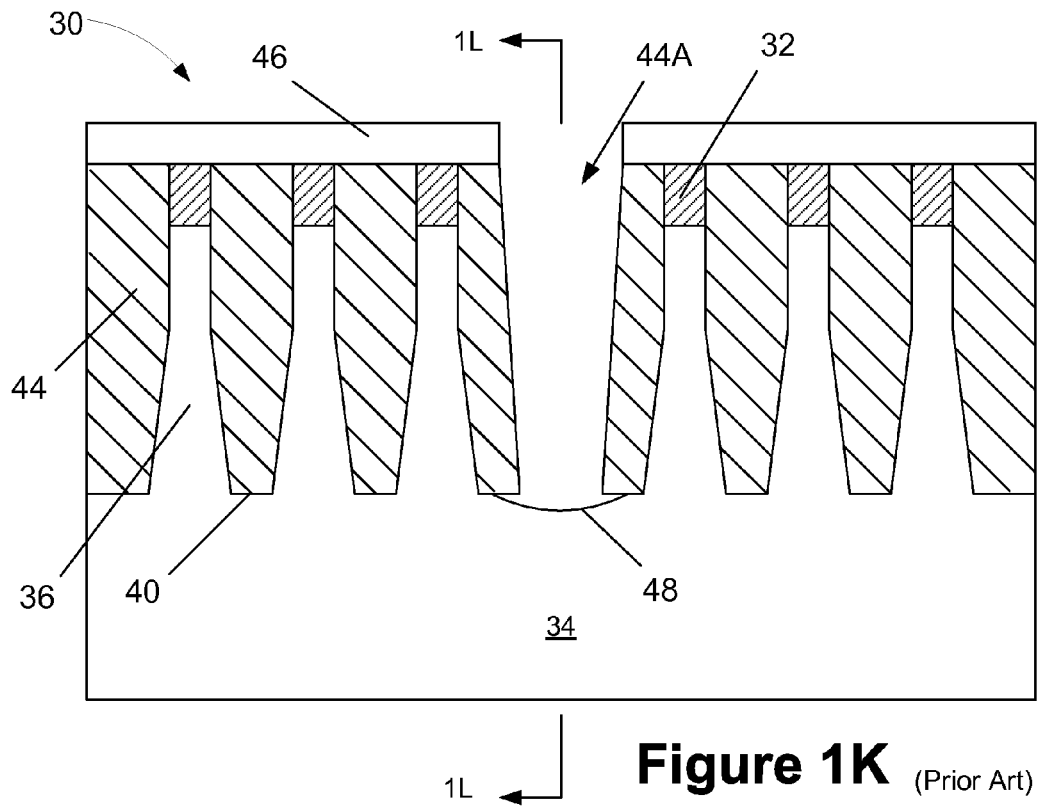
Figure 1K (Prior Art)
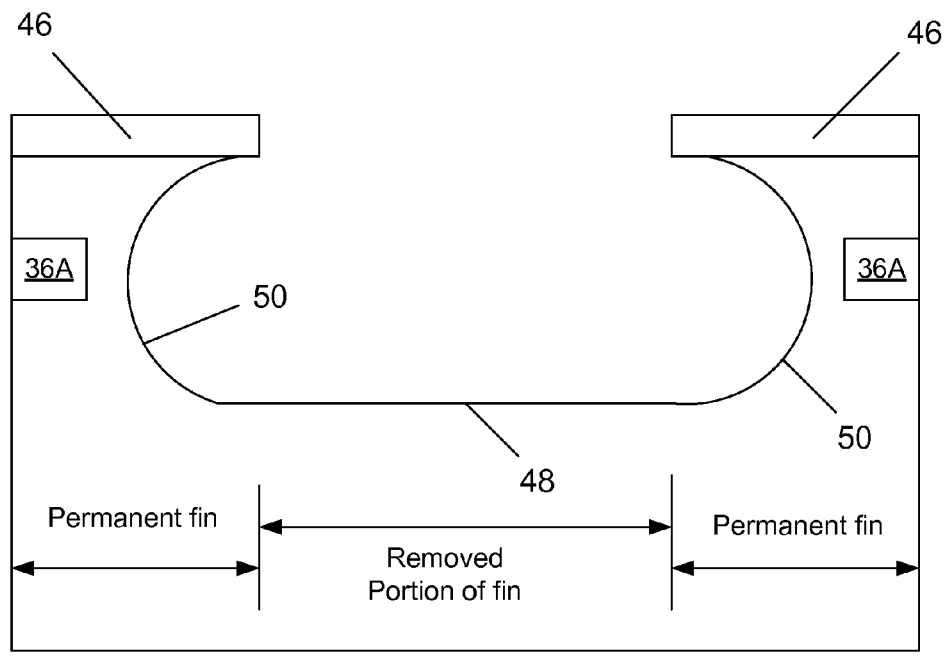
(Prior Art) Figure 1L

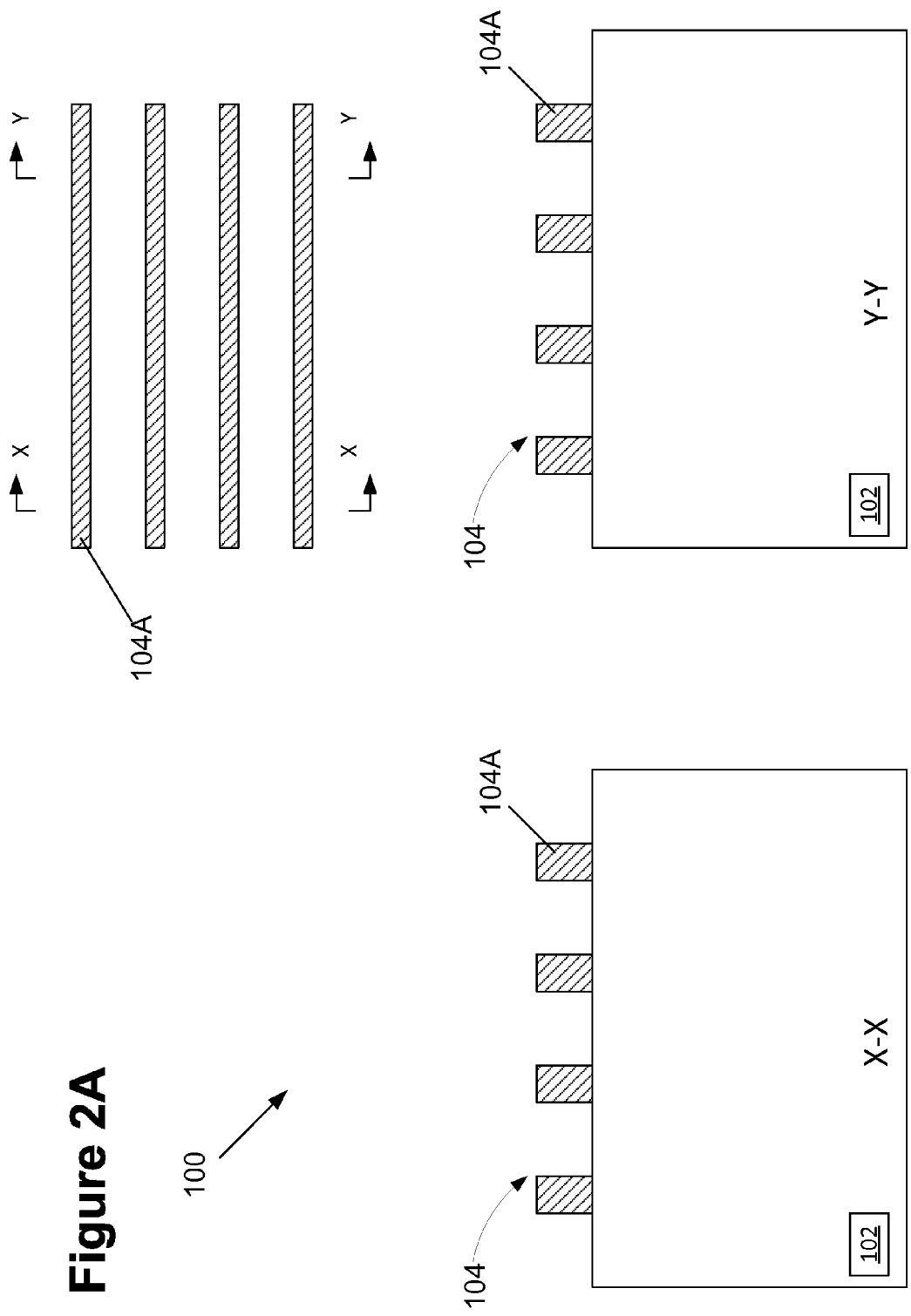

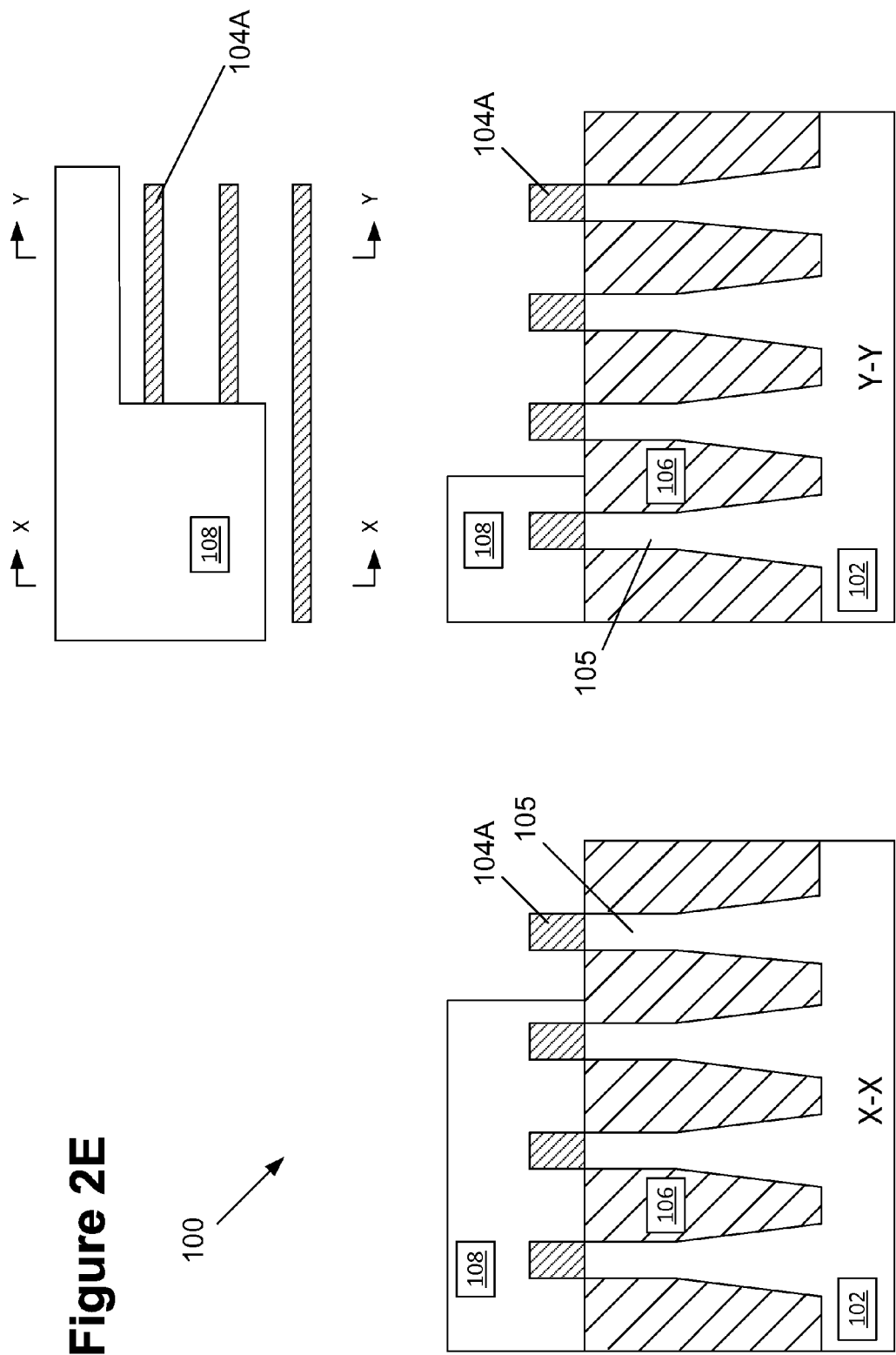

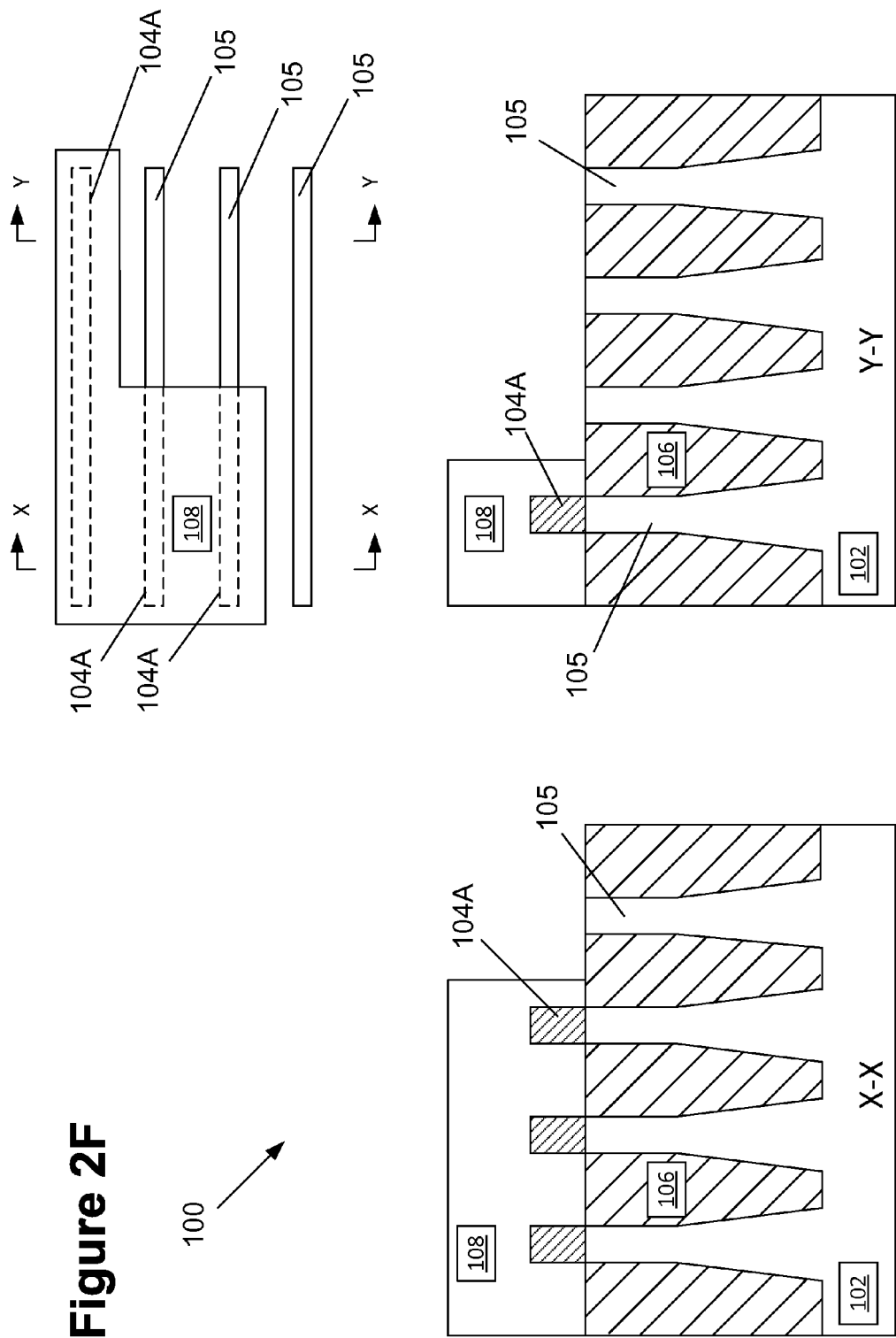

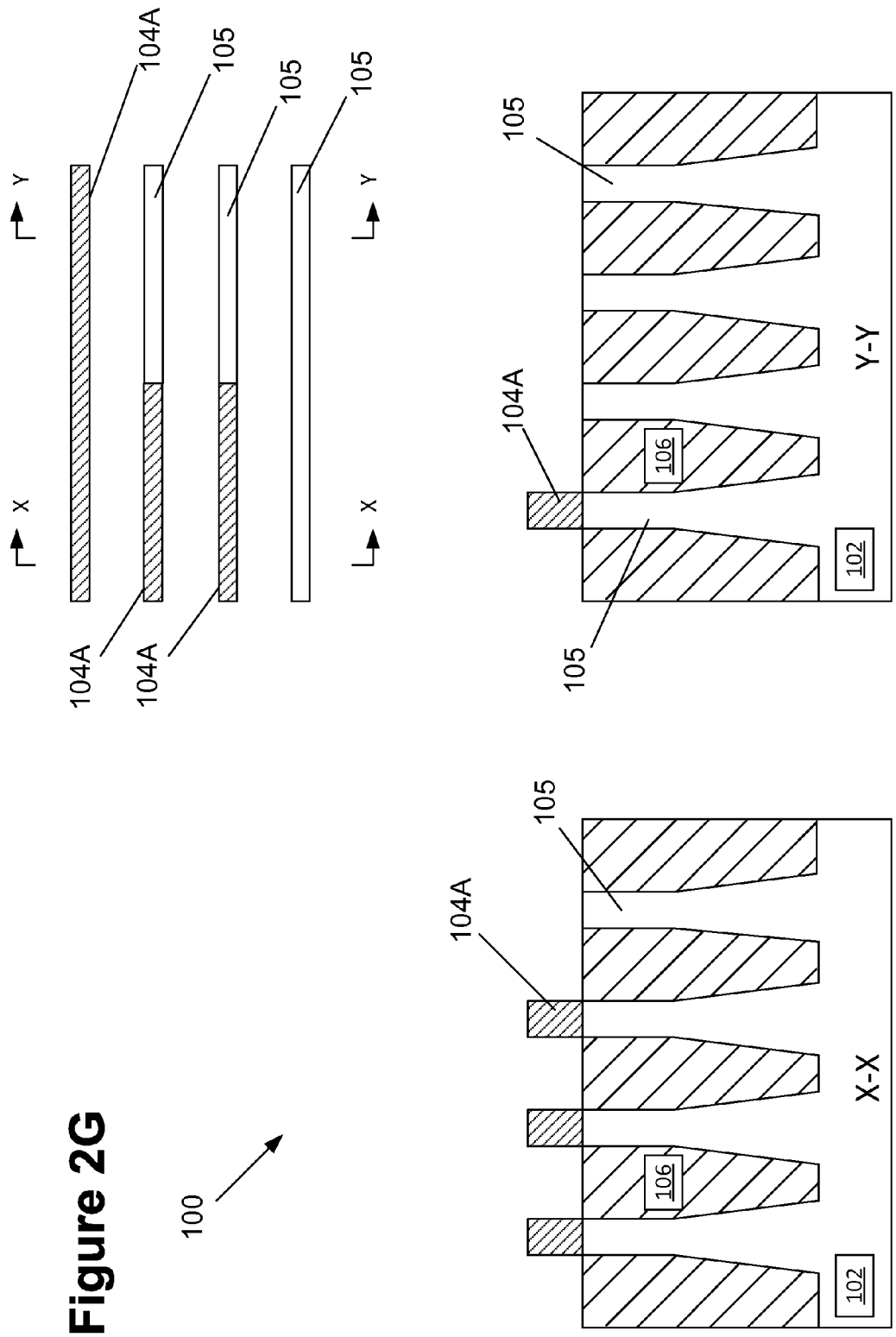

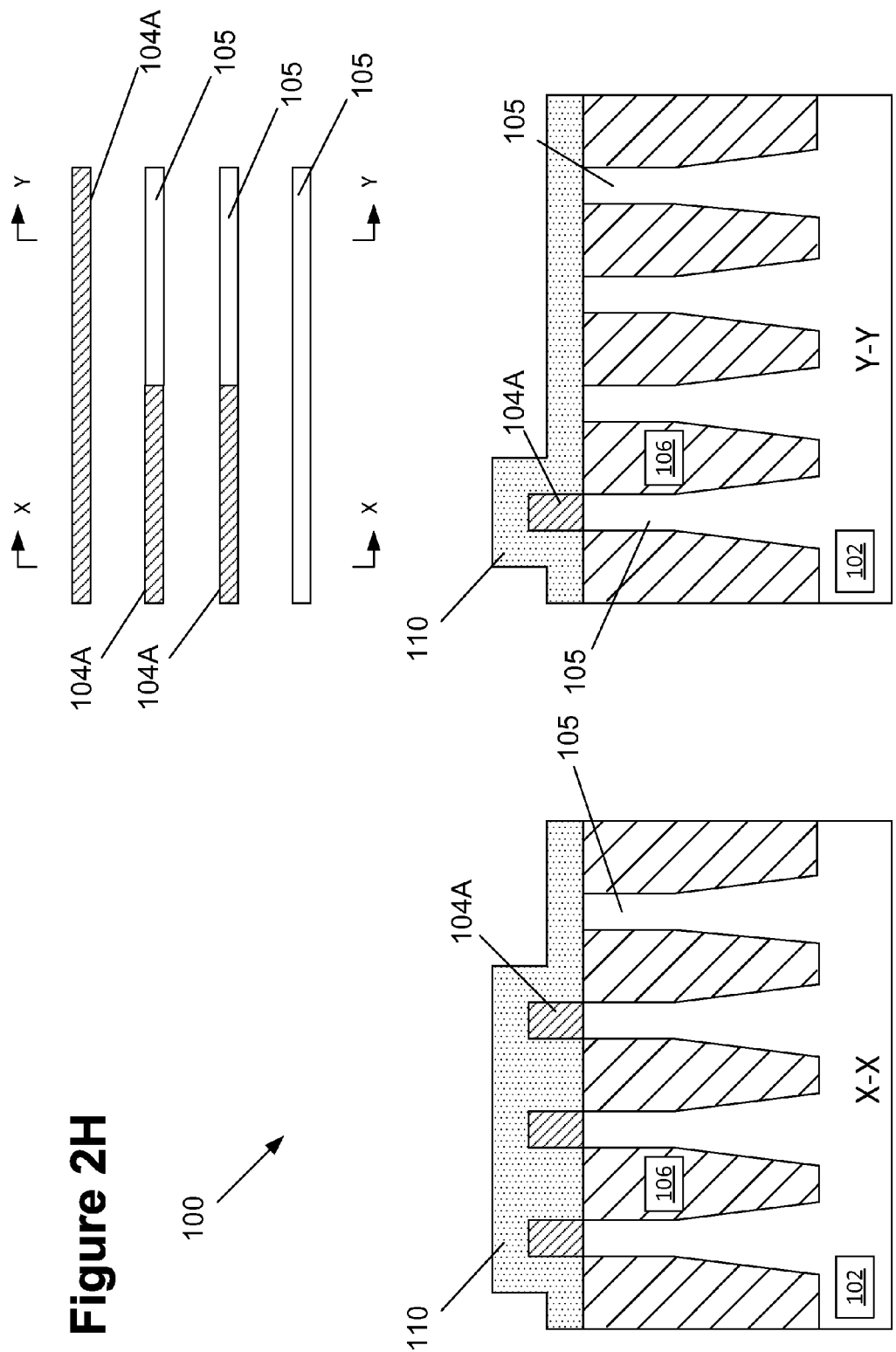

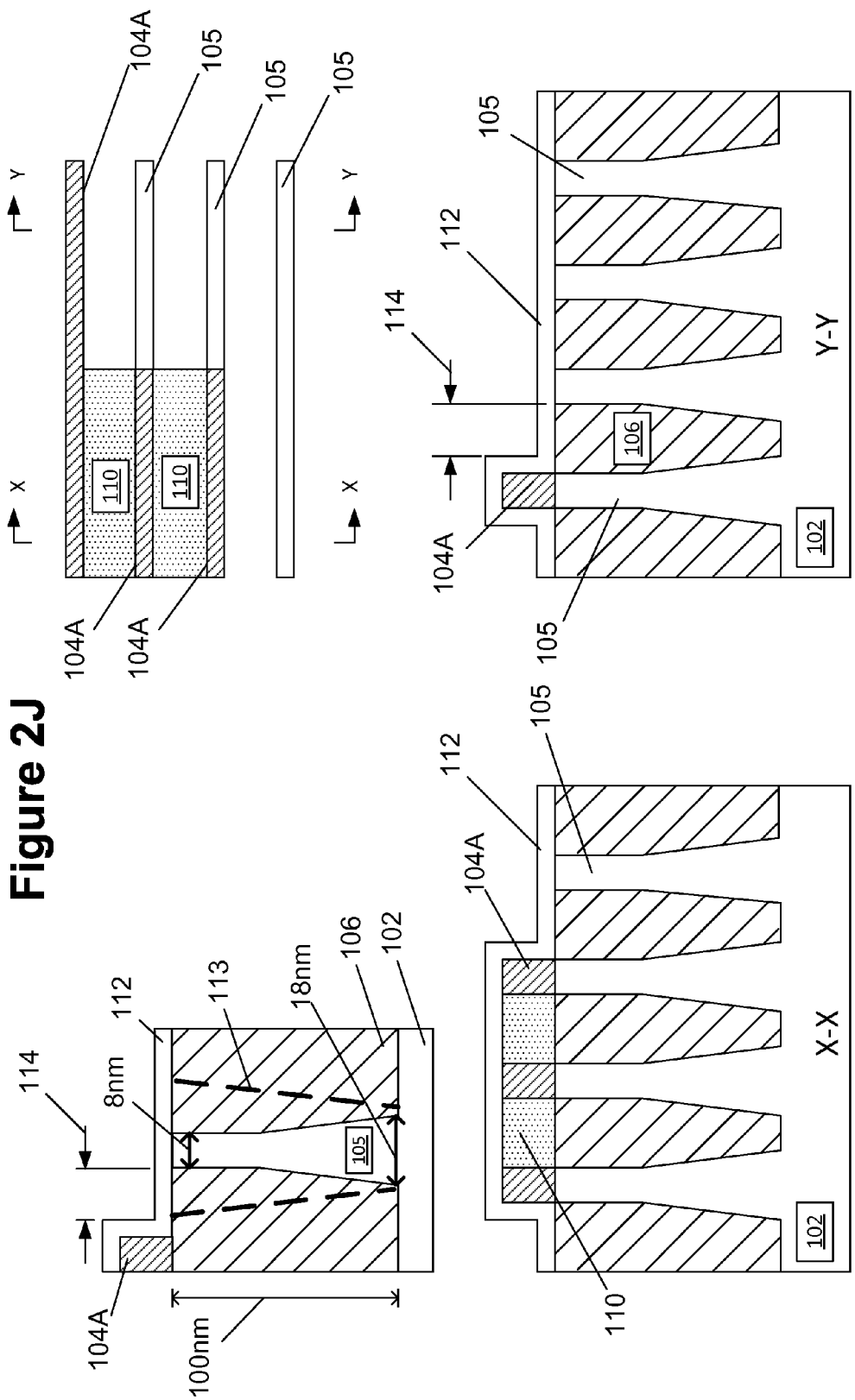

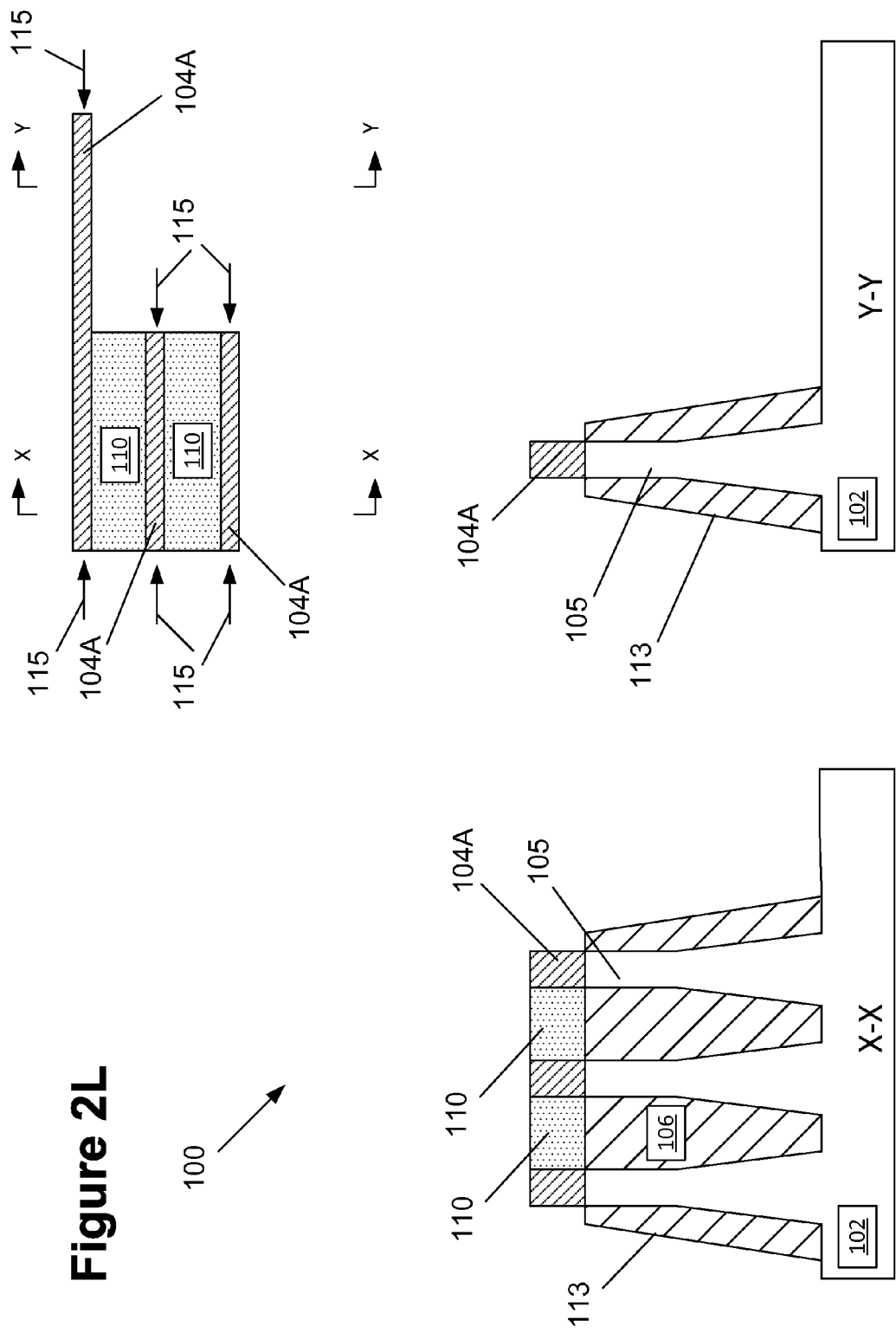

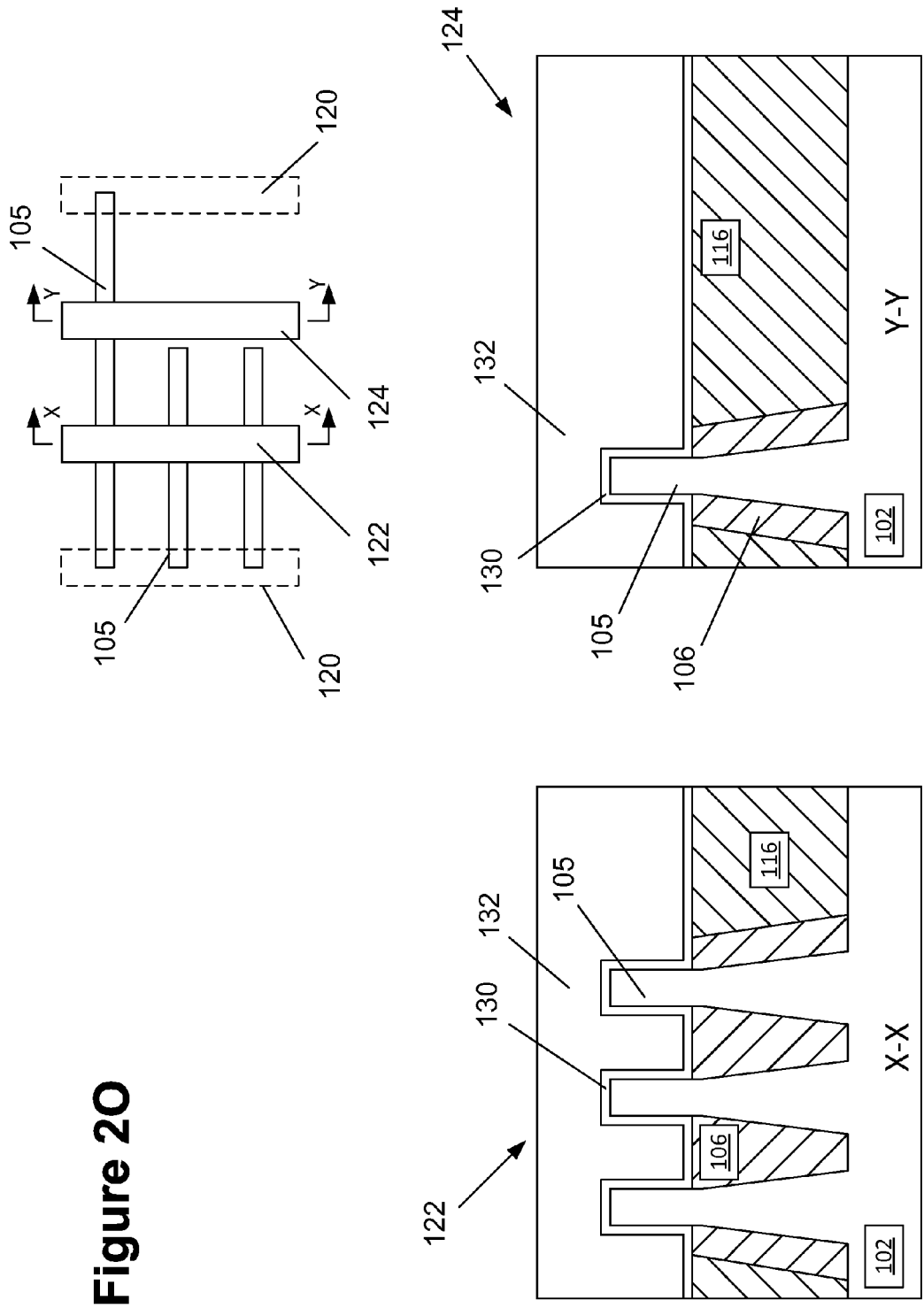

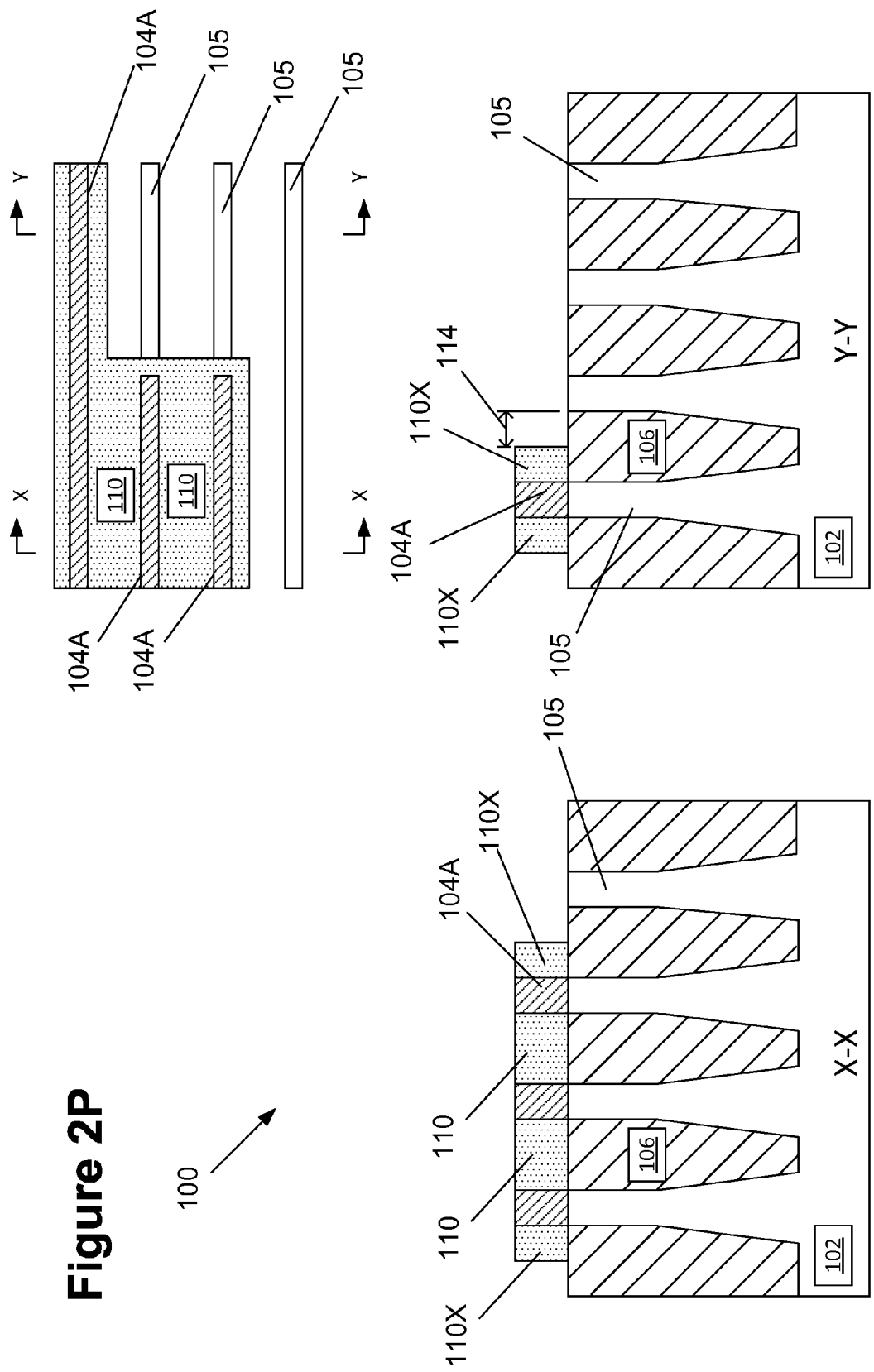

HYBRID FIN CUTTING PROCESSES FOR FINFET SEMICONDUCTOR DEVICES

BACKGROUND OF THE INVENTION

1. Field of the Invention

Generally, the present disclosure relates to the manufacturing of semiconductor devices, and, more specifically, to various hybrid fin cutting processes for FinFET semiconductor devices.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap layer 20. Trenches 22 are formed in the substrate 12 to define the fins 14. A recessed layer of insulating material (not shown) is positioned between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region.

Unlike a planar FET, in a FinFET device, a channel is formed perpendicular to a surface of the semiconducting substrate so as to reduce the physical size of the semiconductor device. A FinFET device may have either a tri-gate or dual-gate channel region. Also, in a FinFET, the junction capacitance at the drain region of the device is greatly reduced, which tends to significantly reduce short channel effects. In a tri-gate FinFET device, the "channel-width" is estimated to be about two times (2×) the vertical fin-height plus the width of the top surface of the fin 14, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

As FinFET devices have been scaled to meet ever increasing performance and size requirements, the width W of the fins 14 has become very small, e.g., 6-12 nm, and the fin pitch has also been significantly decreased, e.g., the fin pitch may be on the order of about 30-60 nm. Accordingly, accurately defining these relatively small fin structures can be challenging. One manufacturing technique that is employed in manufacturing FinFET devices is to initially form the trenches 22 in the substrate 12 to define multiple "fins" that extend across the entire substrate 12, and thereafter remove some of the fins where larger isolation structures will be formed. Using this type of manufacturing approach, better accuracy and repeatability may be achieved in forming the fins 14 to very small dimensions due to the more uniform environment in which the etching process that forms the trenches 22 is performed.

After the trenches 22 have been formed, some of the fins 14 must be removed to create room for or define the spaces where isolation regions will ultimately be formed to separate the individual FinFET devices from one another. As noted above, the fins 14 are typically formed in a regular array. Typically, two separate fin removal or "fin cut" etching processes, involving two different etching masks, are performed to remove the unwanted fins (or portions thereof). One of these fin-removal etching processes is sometimes referred to as a so-called "FC cut" process, while the other fin-removal etching process is sometimes referred to as a so-called "FH cut" process. The FC cut and the FH cut may be performed in either order, although typically the FC cut process is performed first. The FC cut process is performed to cut the fins 14 in the direction that crosses the plurality of fins 14 by removing portions of the axial length of the fins exposed by an FC cut mask (e.g., photoresist). The FC cut process essentially defines the axial length of the fins 14 that will be positioned above one or more active regions. This FC cut process is typically an anisotropic cut process. The FH cut process is performed to remove one or more of the fin segments in a direction parallel to the plurality of fins 14 by removing portions of the axial length of the fins (or sometimes the entire axial length of a fin) located outside of and exposed by an FH cut mask. The FH cut process may be either an anisotropic or isotropic etch process depending upon the particular technique employed, as discussed more fully below.

One such removal technique used for the FH cut process is typically referred to as "Fins-cut-First," as will be described with reference to FIGS. 1B-1E. In general, in this process, the portion of the fin to be removed is not actually formed in the substrate. Rather, the patterned fin-formation etch mask 32 is modified such that the underlying substrate material where such a fin portion would otherwise be formed is removed when the fin-formation trenches are etched into the substrate. Accordingly, FIG. 1B depicts a product 30 after a patterned fin-formation hard mask layer 32, e.g., a patterned layer of silicon nitride/silicon dioxide, was formed above the substrate 34 in accordance with the desired fin pattern and pitch. In the depicted example, only a single fin will be removed, i.e., the fin 36 corresponding to the feature 32A, to make room for an isolation region. However, as will be recognized by those skilled in the art, depending upon the desired final size of the isolation region, more than one fin may be removed.

FIG. 1C depicts the product 30 after a patterned masking layer 38, e.g., a patterned layer of photoresist, was formed above the patterned fin-formation hard mask layer 32. The patterned masking layer 38 has an opening that exposes the feature 32A (for a certain axial length into and out of the drawing page) for removal.

FIG. 1D depicts the product 30 after an etching process was performed through the patterned masking layer 38 so as to remove the exposed feature 32A of the patterned fin-formation hard mask layer 32.

FIG. 1E depicts the device 30 after the patterned masking layer 38 was removed and after a fin-formation etching process was performed through the patterned fin-formation hard mask layer 32 (without the feature 32A) so as to define full-depth trenches 40 in the substrate 34 that define the desired fins 36 across the entire substrate. Due to the removal of the feature 32A, the fin-formation etching process removes the portions of the substrate 34 that would have otherwise formed a fin 36 in the area under the feature 32A. One problem with the Fins-cut-First approach is that it inevitably causes variations in fin sizes, i.e., the dimensions 36X and 36Y are different for different fins. This is especially true between fins 36 inside an array of fins and the fins at the edge of the active region that is close to the isolation region. Such variations in fin sizes may lead to unacceptable variations in device performance. Such variations in fin sizes are caused by variable etch loading effects wherein there are different etch rates that result in different etch profiles for the fins 36 due to differing patterning densities, pitch, etc. However, one benefit of the Fins-cut-First approach is that an anisotropic etching process may be performed when forming the trenches 40 since the technique involves removing substantially all of the substrate material where the undesired fin would have otherwise been formed and there is little chance of damaging laterally adjacent fin structures.

FIG. 1F depicts the product 30 after several process operations were performed. First, a layer of insulating material 42, such as silicon dioxide, was formed so as to overfill the trenches 40. Next one or more chemical mechanical polishing (CMP) processes were performed to planarize the upper surface of the insulating material 40 with the top of the fins 36 and thereby remove the patterned fin-formation hard mask 32. Thereafter, an etch-back process was performed to recess the layer of insulating material 42 between the fins 36 and thereby expose the upper portions of the fins 36, which corresponds to the final fin height of the fins 36. Next, a gate structure (not shown) for the product 30 may be formed using either gate-first or gate-last manufacturing techniques.

Another technique employed during the FH cut process is typically referred to as "Fins-cut-Last," and it will be generally described with reference to FIGS. 1G-1L. FIG. 1G depicts the product 30 after the patterned fin-formation hard mask layer 32 was formed above the substrate 34 in accordance with the desired fin pattern and pitch. As before, in the depicted example, only a single fin will be removed, i.e., the fin 36 corresponding to the feature 32A, to make room for the isolation region.

FIG. 1H depicts the product 30 after a fin-formation etching process was performed through the patterned fin-formation hard mask layer 32 so as to define the full-depth trenches 40 in the substrate 34 that define the fins 36 across the entire substrate. Note that, in the Fins-cut-Last approach, the size of the fins is very uniform, i.e., the dimension 36A is approximately equal to the dimension 36B. This is primarily due to the fact that, in this approach, fins 36 are formed everywhere on the wafer in a substantially uniform etch environment, i.e., there is no undesirable etch loading effects to cause variations in fin sizes.

FIG. 1I depicts the product 30 after several process operations were performed. First, a layer of insulating material 44, such as silicon dioxide, was formed so as to overfill the trenches 40. Then a CMP process was performed to planarize the upper surface of the layer of insulating material 44 with the patterned fin-formation hard mask layer 32. Next, a patterned masking layer 46, e.g., a patterned layer of photoresist, was formed above the layer of insulating material 44. The patterned hard mask layer 46 has an opening that is positioned above the underlying fin 36 that is to be removed.

FIG. 1J depicts the product 30 after one or more etching processes were performed to remove the exposed portions of the layer of insulating material 44 and the exposed portion of the fin-formation hard mask layer 32, i.e., the feature 32A, thereby forming a trench 44A in the layer of insulating material 44 that exposes the fin 36 that is to be removed. Inevitably, there will be some tapering of the sidewalls of the trench 44A when it is formed. The patterned masking layer 46 remains in position above the remaining features of the patterned fin-formation hard mask 32 when the opening is formed.

FIG. 1K depicts the product 30 after an isotropic fin-removal etching process was performed to remove the exposed axial-length portion of the fin 36 which, given the isotopic nature of the fin-removal etch process, results in a small trench 48 in the substrate 34. An isotropic etching process is performed to ensure complete remove of the fin, especially the portions of the fin 36 near the bottom of the trench 48. Although not depicted in the drawings, after the trench 48 is formed, the patterned masking layer 46 will be removed and additional oxide material (not shown) will be formed in the trench 44A where the fin 36 was removed. Then a chemical mechanical polishing (CMP) process will be performed to planarize the upper surface of all of the insulating materials with the top of the patterned fin-formation hard mask 32. Thereafter, the isolation regions between devices will be masked and an etch-back process will be performed to recess the layer of insulating material 44 between the fins 36 for each device and thereby expose the upper portions of the fins 36, which corresponds to the final fin height of the fins 36.

FIG. 1L is a cross-sectional view taken where indicated in FIG. 1K, i.e., through the axial length of the fin 36 where a portion of the axial length of that fin was removed. Typically, only a portion of the entire axial length of the fin 36 will be removed as other portions of the initially formed fin 36 will serve as permanent fins 36A for other FinFET devices. One problem with the Fins-cut-Last approach is that, due to the isotropic nature of the fin removal etching process, the cut ends 50 of the permanent fins 36A that are adjacent the portion of the fin 36 that was removed are typically subjected to relatively severe undercutting, as depicted in FIG. 1L. Such fin undercutting can adversely impact the performance of the FinFET devices that are made using the permanent fins 36A.

As it relates to the formation of FinFET devices, the number of fins of a FinFET device is an important consideration. In general, a FinFET device with a greater number of fins tends to exhibit greater performance than a FinFET device with a lesser number of fins. Accordingly, all other things being equal, a FinFET device with a relatively greater number of fins would be a candidate for various high performance applications, such being included as part of a critical path for a logic circuit on an integrated circuit product. On the other hand, FinFET devices with a lesser number of fins may be more suitable for applications involving less relative power consumption, as such FinFET devices tend to exhibit relatively lower off-state leakage currents. Accordingly, such FinFET devices may be employed in non-critical path circuits where power consumption and power management is an important factor.

In general, there are two different ways that may be employed in an attempt to produce FinFET devices with different numbers of fins. Historically, FinFET devices have been formed in and above active regions that have a rectangular configuration. FIG. 1M is a simplistic depiction of one illustrative example of how different FinFET devices, each having a different number of fins, may be formed above spaced-apart active regions that have a rectangular configuration. As shown therein, the product is comprised of a plurality of fins 14, a plurality of dummy gates 52 and a plurality of active gates 54. First and second FinFET devices 56, 58 (each of which are two-fin devices) are formed in and above spaced-apart rectangular active regions 60, 62, respectively. FIG. 1M also depicts first and second FinFET devices 64, 66 (each of which are three-fin devices) formed in and above spaced-apart rectangular active regions 68, 70, respectively. Such a configuration does result in a plurality of FinFET devices 56, 58, 64 and 66 having a different number of fins. However, each of the FinFET devices are formed above spaced-apart, rectangular shaped active regions 60, 62, 68 and 70, respectively. One positive aspect of the embodiment shown in FIG. 1M is that there is little or no undercutting of the cut end surface of the fins, as described in FIGS. 1K-1L above (see surface 50 in FIG. 1L). One negative aspect of the approach depicted in FIG. 1M, is that there is a relatively significant area penalty (e.g., 10-20%) associated with forming the four spaced-apart, rectangular active regions 60, 62, 68 and 70.

FIG. 1N depicts another illustrative way wherein FinFET devices may be formed with a different number of fins. In this embodiment, so-called "tapered" FinFET devices 80, 82 are formed in and above non-rectangular shaped active regions 84, 86, respectively. At the bottom of FIG. 1N, the non-rectangular shaped active region 86 is shown by itself so as to clearly show its non-rectangular configuration when viewed from above. A FinFET device formed above a non-rectangular shaped active region (as opposed to a traditional rectangular shaped active region) may be generally referred to as a "tapered" FinFET device, in that the active region is configured or tapered (i.e., non-rectangular) so as to allow formation of FinFET devices (with different numbers of fins) above that tapered, non-rectangular shaped active region. In the depicted example, each of the tapered FinFET devices 80, 82 include a two-fin FinFET device and a three-fin FinFET device. Such tapered FinFET devices offer significant scaling benefits as compared to the traditional FinFET devices shown in FIG. 1M that are formed above the spaced-apart rectangular active regions 60, 62, 68 and 70. However, one drawback to forming tapered FinFET devices is that, when removing fins as described above, there will typically be significant undercutting of the fins due to the isotropic fin-removal etch process that is performed to remove undesired portions of the axial length of the fins during Fins-cut-Last approach that is used during the FH cut process, as described above. As noted above, such fin undercutting can tend to degrade device performance.

The present disclosure is directed to various hybrid fin cutting processes for FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various hybrid fin cutting processes for FinFET semiconductor devices. One illustrative method disclosed herein includes, among other things, forming a fin-removal masking layer above a plurality of fins and above an insulating material positioned between the fins, wherein the fin-removal masking layer is comprised of a plurality of line-type features, each of which is positioned above one of the fins, and a masking material positioned at least between adjacent line-type features of the fin-removal masking layer and above portions of the insulating material in the trenches. The method also includes, with the fin-removal masking layer in position above the substrate, performing at least one anisotropic etching process through the fin-removal masking layer to remove the portions of the fins to be removed, removing the fin-removal masking layer and recessing at least the layer of insulating material in the trenches, wherein the recessed layer of insulating material has a recessed surface that exposes a portion of the remaining fins.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1L depict illustrative prior art methods of removing selected fin structures when forming FinFET semiconductor devices;

Figure 1M:
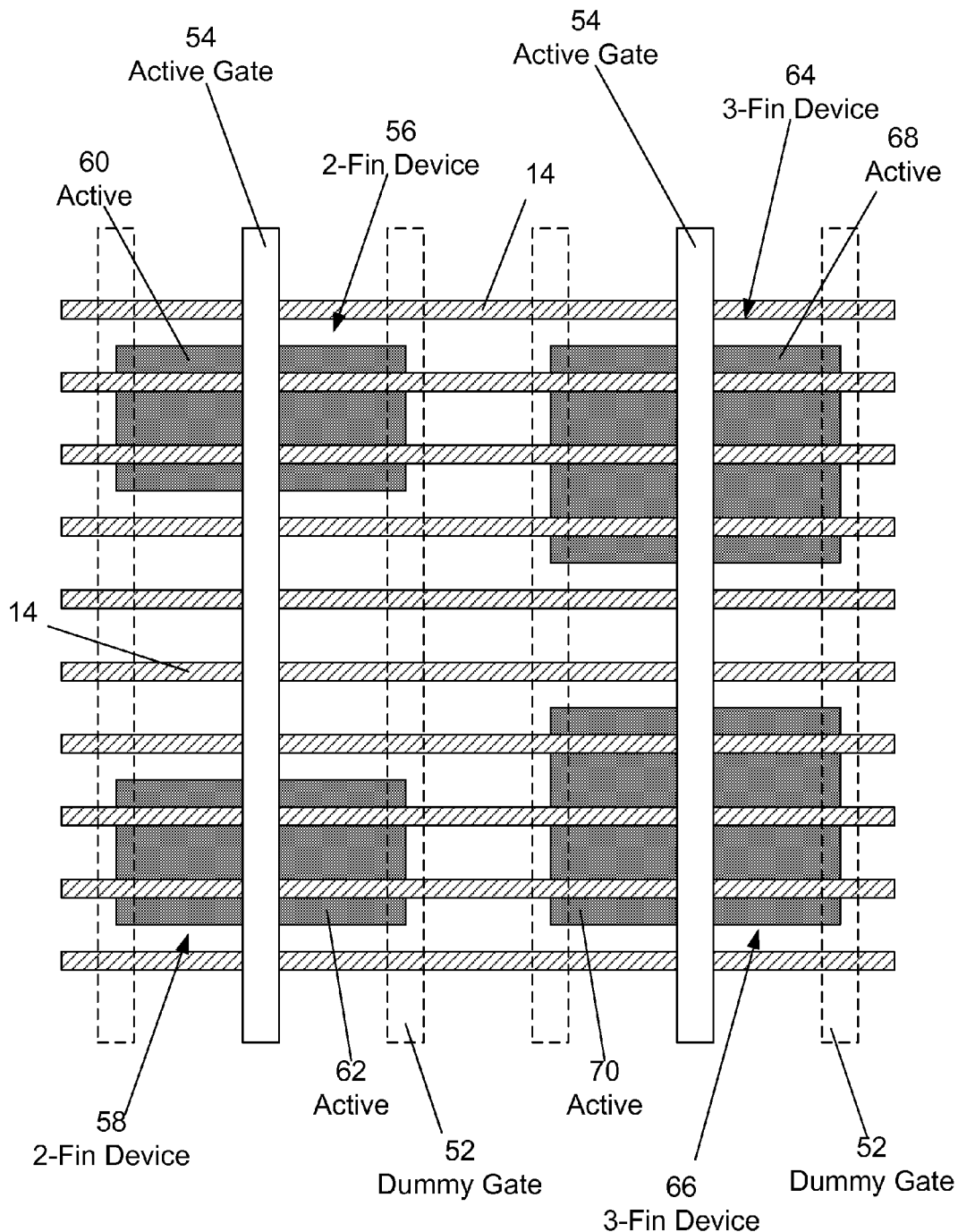
FIGS. 1M-1N depict illustrative possible layout configurations for FinFET devices that each have different numbers of fins.
Figure 1N:
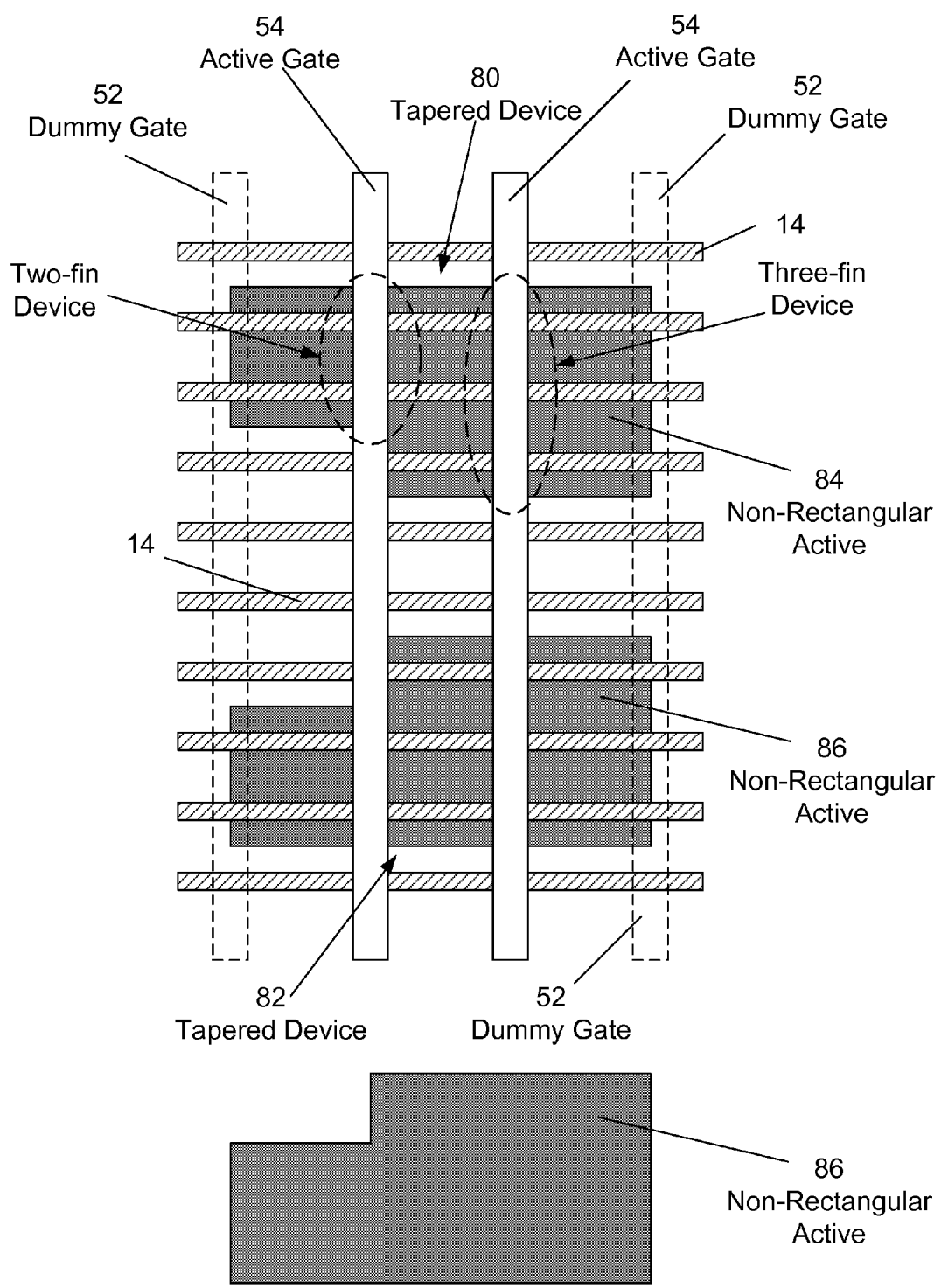

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various hybrid fin cutting processes for FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2P depict various illustrative hybrid fin cutting processes disclosed herein for cutting fins for FinFET semiconductor devices. A simplistic plan view is depicted in the upper right-hand corner of the drawings so as to indicate where various cross-sectional views in the drawings are taken. The drawings depict the formation of an integrated circuit product comprised of a tapered FinFET semiconductor device 100 that is formed in and above a bulk semiconducting substrate 102. As will be recognized by those skilled in the art after a complete reading of the present application, the illustrative tapered FinFET device 100 described herein may be comprised of either N-type FinFET devices, P-type FinFET devices or any combinations of such N- and P-type devices. In this illustrative embodiment, the substrate 102 has a bulk semiconducting material configuration. The substrate 102 may be made of silicon or it may be made of materials other than silicon. Thus, the terms "substrate" or "semiconducting substrate" should be understood to cover all forms of all semiconductor materials.

FIG. 2A depicts the device 100 after a patterned fin-formation masking layer 104, e.g., a patterned hard mask layer, was formed above the substrate 102 that is comprised of a plurality of line-type features 104A that correspond to the desired pattern of fins to be formed in the substrate 102. The patterned fin-formation masking layer 104 is intended to be representative in nature as it may be comprised of a variety of materials, such as, for example, a photoresist material, silicon nitride, silicon oxynitride, etc. Moreover, the patterned fin-formation masking layer 104 may be comprised of multiple layers of material, such as, for example, a silicon nitride layer and a layer of silicon dioxide. The patterned fin-formation masking layer 104 may be formed by depositing the layer(s) of material that comprise the masking layer 104 and thereafter directly patterning the masking layer 104 using known photolithography and etching techniques. Alternatively, the patterned fin-formation masking layer 104 may be formed by using known sidewall image transfer techniques. Thus, the particular form and composition of the patterned fin-formation masking layer 104 and the manner in which it is made should not be considered a limitation of the present invention.

Figure 2B:
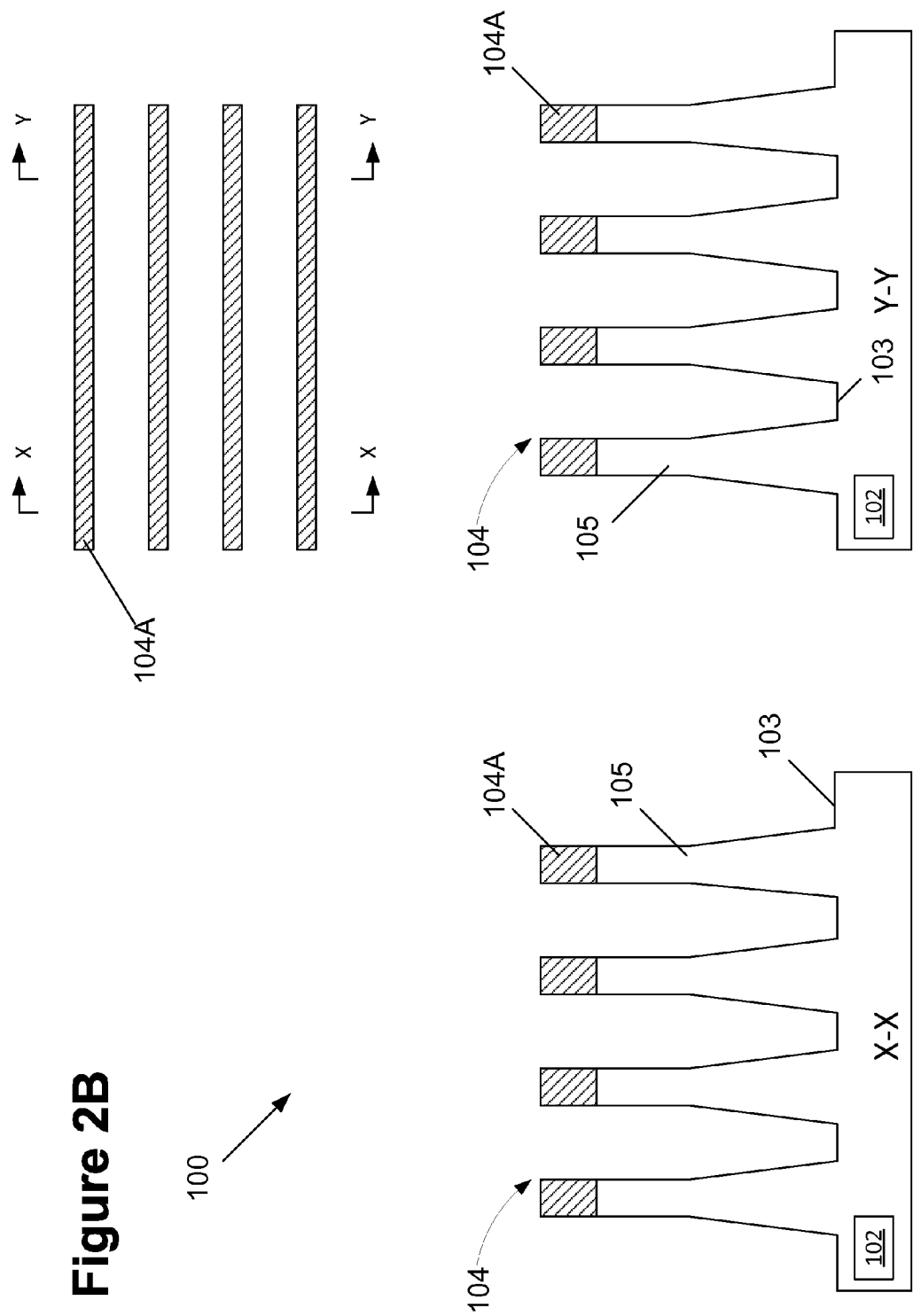
FIGS. 2A-2P depict various illustrative hybrid fin cutting processes disclosed herein for cutting fins for FinFET semiconductor devices.

FIG. 2B depicts the device 100 after a fin-formation etching process was performed through the patterned fin-formation masking layer 104 to define a plurality of fin-formation trenches 103 in the substrate 102. The fin-formation trenches 103 define a plurality of fins 105. Due to the fact that the fins 105 are formed across the substrate, there is little or no undesirable variation in the width (CD) of the fins 105 since there is no adverse etch loading effects, as discussed in the background section of this application. In the illustrative example depicted in the attached figures, the fin-formation trenches 103 and the fins 105 are all of a uniform size and shape. However, such uniformity in the size and shape of the fin-formation trenches 103 and the fins 105 is not required to practice at least some aspects of the inventions disclosed herein. In the example depicted herein, the fin-formation trenches 103 are depicted as having been formed by performing a plurality of anisotropic etching processes. In some cases, the fin-formation trenches 103 may have a reentrant profile near the bottom of the fin-formation trenches 103. To the extent the fin-formation trenches 103 are formed by performing a wet etching process, the fin-formation trenches 103 may tend to have a more rounded configuration or non-linear configuration as compared to the generally linear configuration of the fin-formation trenches 103 that are formed by performing an anisotropic etching process. In the depicted example, the fin-formation trenches 103 may be formed in such a manner that the fins 105 have a tapered cross-sectional configuration (wider at the bottom than at the top at this point in the process flow). Thus, the size and configuration of the fin-formation trenches 103, and the manner in which they are made, should not be considered a limitation of the present invention.

Figure 2C:
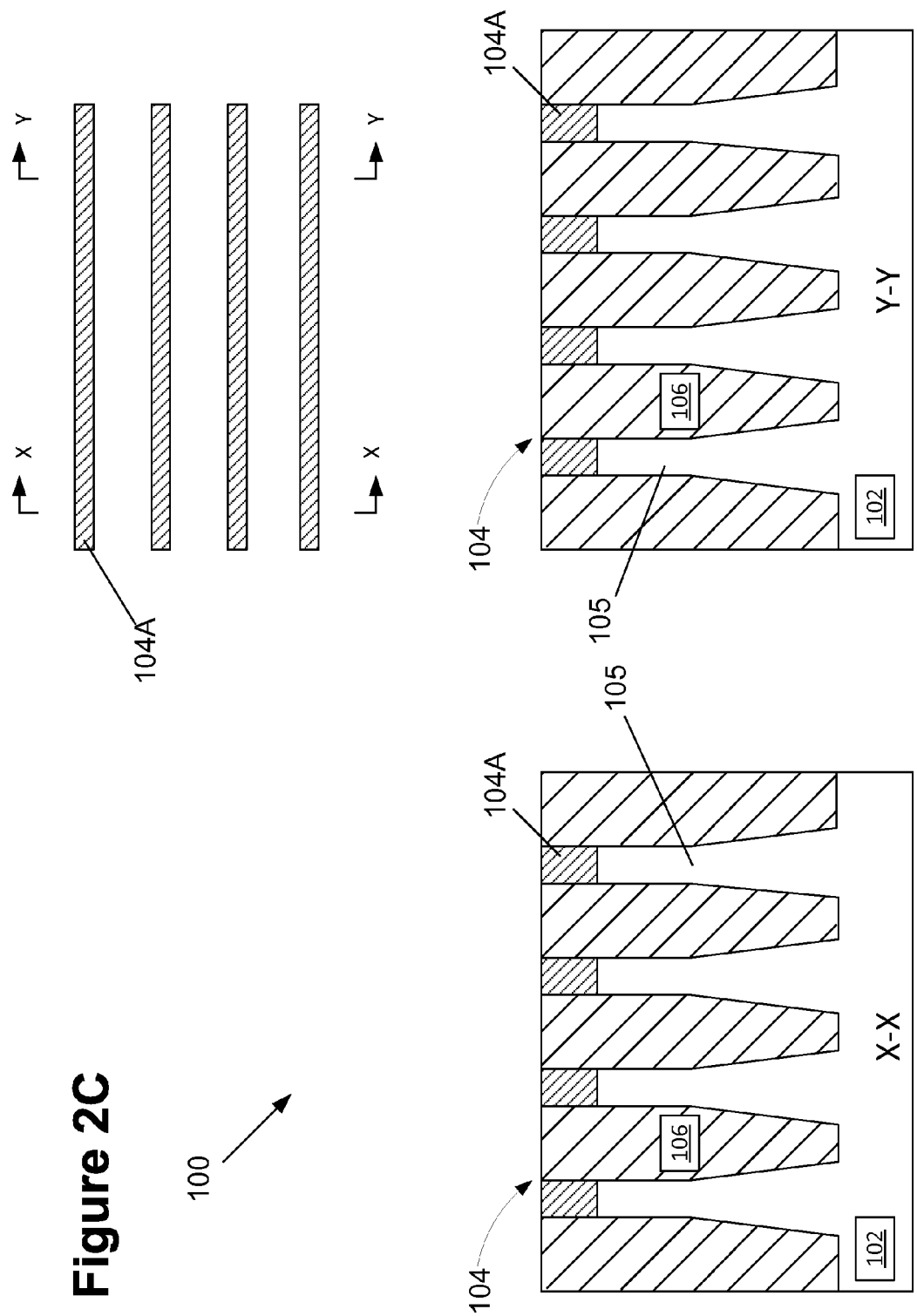

FIG. 2C depicts the device 100 after several process operations were performed. First, a layer of insulating material 106, such as silicon dioxide, was formed so as to overfill the fin-formation trenches 103. A chemical mechanical polishing (CMP) process was then performed to planarize the upper surface of the insulating material 106 with the top of the patterned fin-formation hard mask layer 104.

Figure 2D:
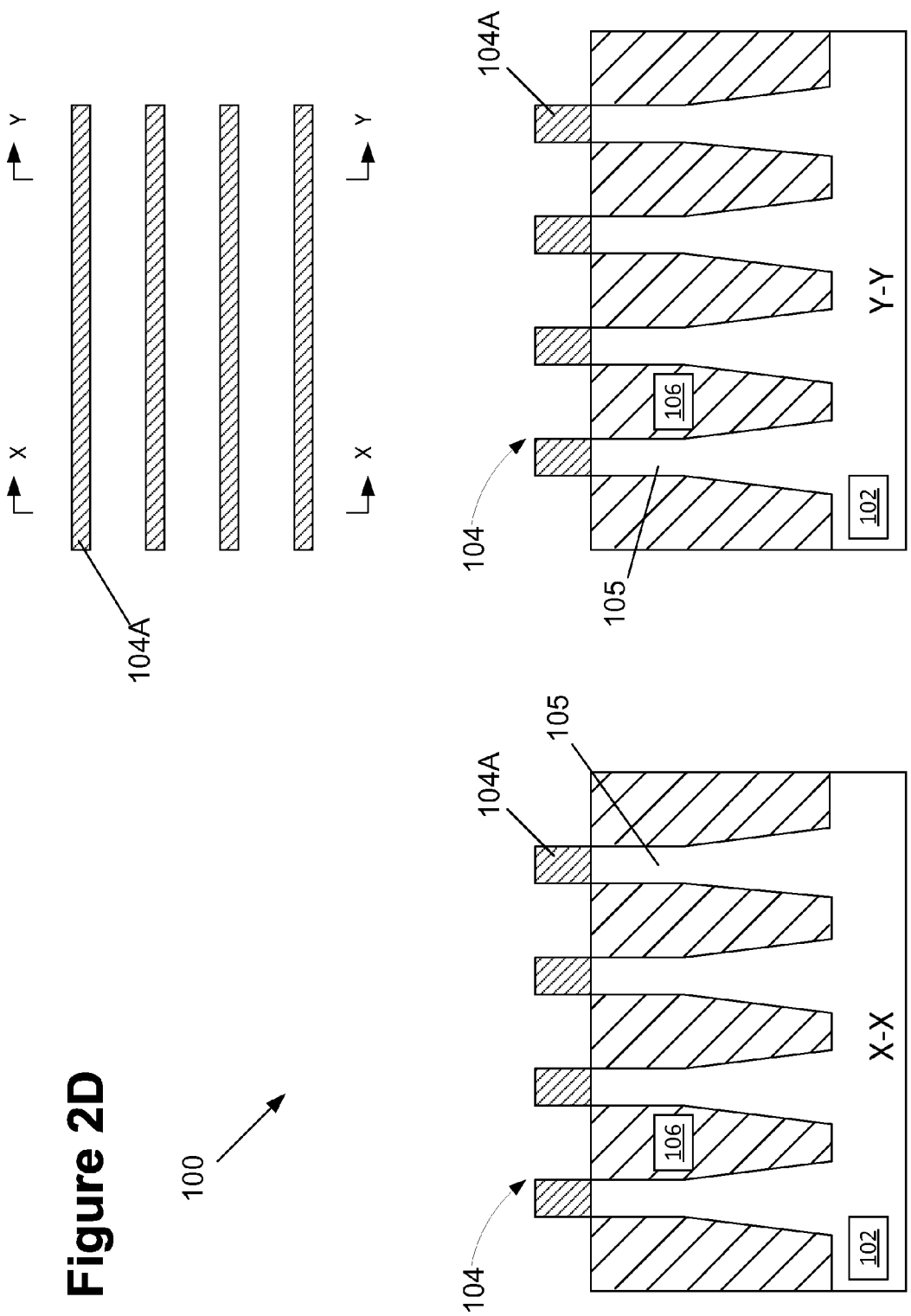

FIG. 2D depicts the device 100 after an etch-back process was performed to recess the layer of insulating material 106 to the desired level so as to thereby expose the patterned fin-formation hard mask 104.

FIG. 2E depicts the device 100 after a patterned etch mask 108 comprised of a patterned layer of photoresist, OPL or a hard mask material, was formed above the device 100. The patterned etch mask 108 exposes axial length portions of the line-type features 104A of the patterned fin-formation hard mask layer 104 that are desired to be removed.

FIG. 2F depicts the device 100 after an anisotropic etching process was performed on the device 100 to remove the exposed portions of the line-type features 104A of the patterned fin-formation hard mask layer 104. This etching process exposes the underlying fins 105. As depicted, the masking layer 108 protects the remaining line-type features 104A of the patterned fin-formation hard mask 104.

FIG. 2G depicts the device 100 after the masking layer 108 was removed. Depending upon the material selected for the masking layer 108, it may be removed by performing a wet-stripping process or an etching process. As depicted, this etching process results in a modified patterned fin-formation hard mask 104 that was modified after the fins 105 were initially formed by performing the fin-formation etching process through the original patterned fin-formation hard mask 104, as shown in FIG. 2B. The fins 105 that are exposed when the line-type features 104A of the patterned fin-formation hard mask 104 are removed will eventually be removed, as described more fully below.

FIG. 2H depicts the device 100 after the formation of a conformal layer of masking material 110 above the modified patterned fin-formation hard mask 104. The layer of masking material 110 may be comprised of a variety of different materials, such as silicon nitride, $Al_2O_3$, etc., and it may be formed to a thickness falling within the range of about 10-15 nm, depending upon the particular application. The layer of material may be formed by any of a variety of processes, e.g., atomic layer deposition (ALD), chemical vapor deposition (CVD), physical vapor deposition (PVD), etc. In one embodiment, the masking material 110 should be made of a material that exhibits good etch selectivity relative to the material(s) of the patterned fin-formation hard mask 104, the layer of insulating material 106 and the fins 105. In other embodiments, such etch selectivity may not be required as portions of the masking material 110 may be removed (as described more fully below) by performing an isotropic etch back process that may be very accurately controlled. Note that, due to the very small fin pitch in advanced devices, e.g., 24-50 nm, the layer of masking material 110 will tend to "pinch-off" and overfill the spaces between the features 104A of the modified patterned fin-formation hard mask 104. So as not to overly complicate the drawings, the layer of masking material 110 is not depicted in the simplistic plan view in FIG. 2H.

Figure 2I:
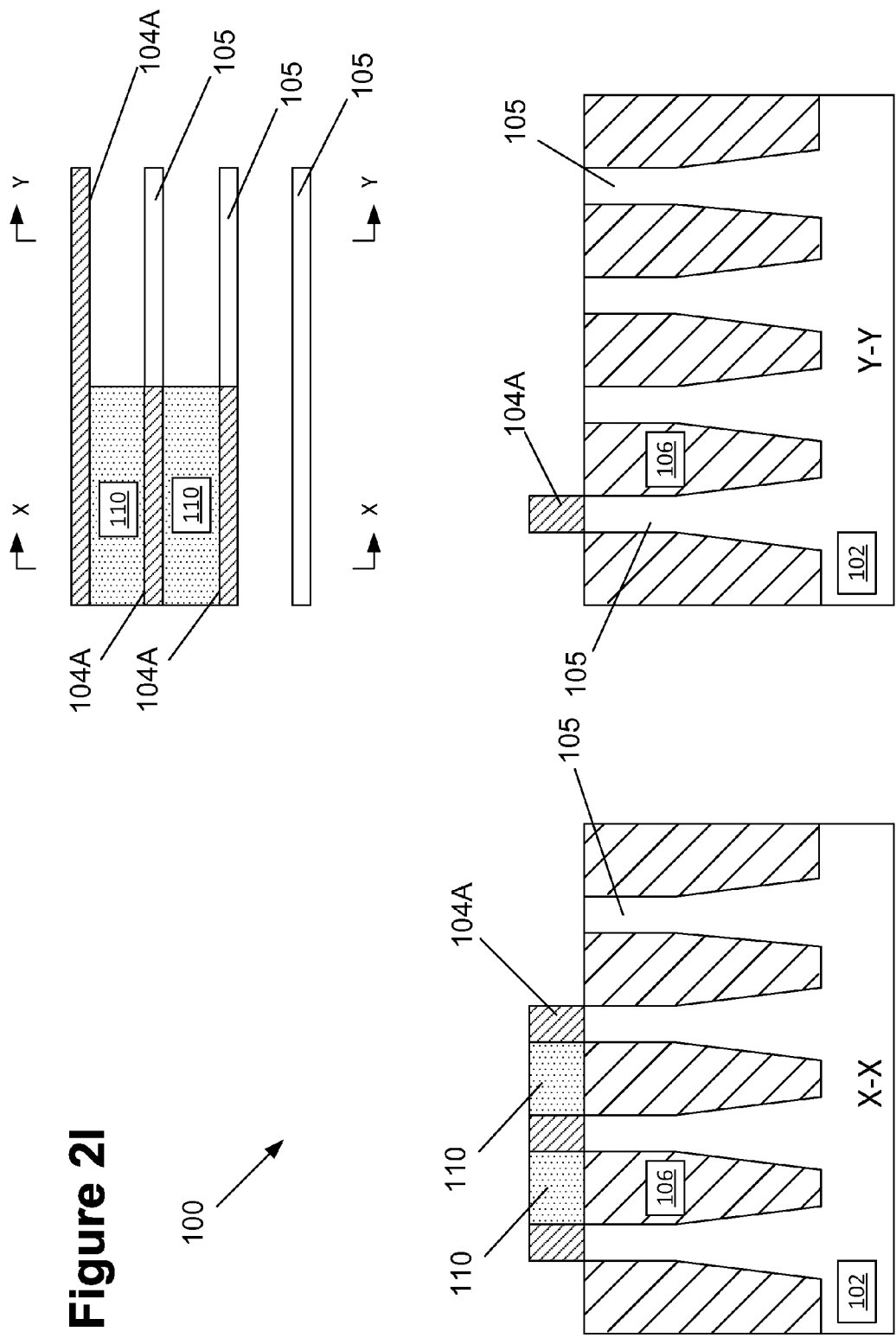

FIG. 2I depicts the device 100 after a timed isotropic etching process was performed to remove portions of the layer of masking material 110. Due to the overfilling of the spaces between the line-type features 104A of the modified patterned fin-formation hard mask 104, portions of the layer of masking material 110 remain positioned between the line-type features 104A after the etching process is completed, as depicted. As depicted, the combination of the modified patterned fin-formation hard mask 104 (with some portions of the line-type features 104A removed (see FIG. 2G)) and the remaining masking material 110 positioned between the remaining adjacent features 104A of the modified patterned fin-formation hard mask 104 (see FIG. 2I) constitutes a part of a fin-removal masking layer. During the fin-removal etching process (described below), the masking material portions 110 of the fin-removal masking layer will protect the underlying layer of insulating material 106 while the remaining line-type features 104A of the modified patterned fin-formation hard mask 104 will protect the underlying fins 105.

FIG. 2J depicts the device 100 after a conformal layer of insulating material 112 was formed on the device 100 above the fin-removal masking layer. So as not to overly compli-cate the drawings, the layer of material 112 is not depicted in the simplistic plan view in FIG. 2J. The layer of material 112 may be comprised of a variety of different materials, such as silicon dioxide or silicon nitride, and its thickness may vary depending upon the particular application.

In general, in this example, the conformal layer or material 112 may be formed to a thickness such that the lateral distance 114 (see view Y-Y) between the material 112 and the closest edge of the adjacent fin 105 that is to be removed is large enough such that, when the exposed fins are removed (as described more fully below), there will be little or no residual fin material after the fin removal process is completed. An enlarged view of a portion of the cross-sectional view Y-Y is depicted in the upper left corner of FIG. 2J to provide one illustrative example. As depicted, in one embodiment, during the etching process, an opening 113 will be formed in the layer of insulating material 106 and the fin 105 will be removed at the same time. In this example, the layer of insulating material 106 has a thickness of about 100 nm, the illustrative fin 105 has a top width of about 8 nm and a base width of about 18 nm. Assuming that the opening 113 will be formed with an 88 degree taper, the dimension 114 needs to be at least 8 nm to insure that all of the fin 105 immediately adjacent the edge of the opening 113 will be removed. Of course, these dimensions may vary depending upon the particular application and geometry involved. In general, the layer of material 112 may be formed so as to have a thickness within the range of about 8-15 nm, depending upon the particular application. The layer of material 112 may be formed by any of a variety of processes, e.g., ALD, CVD, etc. If desired, the opening 113 may be formed prior to the removal of the fins 105 that are exposed by that opening 113.

Figure 2K:
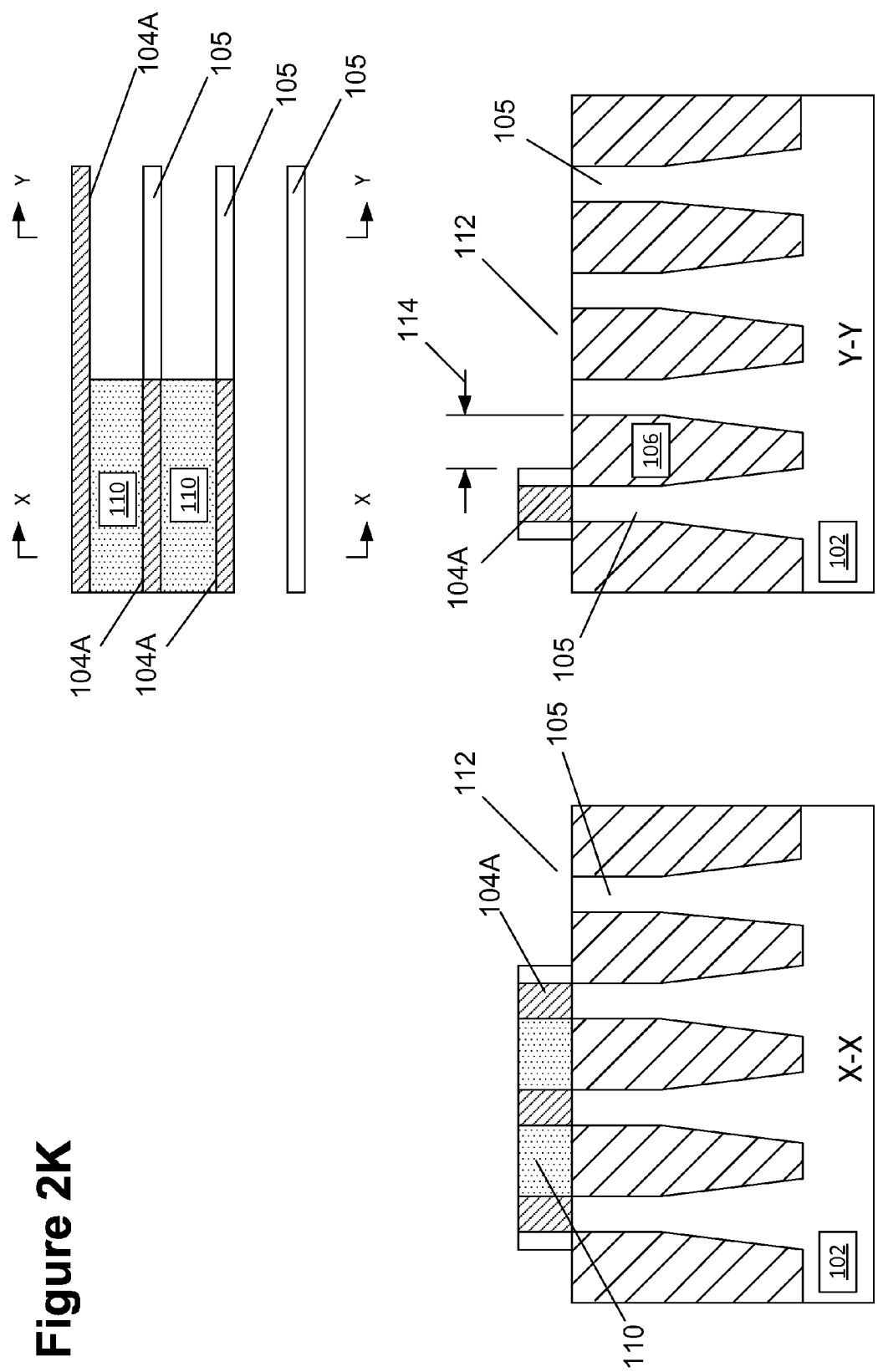

FIGS. 2K-2L depict the device 100 after one or more anisotropic etching processes were performed so as to ultimately result in the removal of the unwanted portions of the fins 105. In one embodiment, the etching processes depicted in FIGS. 2K-2L may be a single anisotropic etching process. As shown in FIG. 2K, the anisotropic etching process will initially open the layer of material 112. Thereafter, the layer of insulating material 106 and the fins 105 that are desired to be removed are etched and removed together by performing a non-selective etching process that removes both the insulating material 106 and the exposed fins 105, e.g., an anisotropic etching process that is non-selective to silicon dioxide and silicon. Note that this etching process is performed on the exposed portions of the layer of insulating material 106 and the fins 105 not covered by the fin-removal masking layer, e.g., including remaining line-type features 104A of the modified patterned hard mask 104 and the remaining portions of the layer of masking material 110, so as to define the opening 113 in the layer of insulating material 106 and remove the fins 105. The layer of material 112 is effectively consumed at the end of this etching process sequence. However, due to the presence of the layer of material 112 during that etch process, the edge of the opening 113 is positioned so as to insure complete removal of the fin 105 adjacent the side of the opening 113. In other embodiments, a plurality of anisotropic etching processes may be performed to remove the desired portions of the layer of material 112, the layer of insulating material 106 and the exposed portions of the fins 105 that are to be removed. For example, a first anisotropic etching process may be performed to form the opening 113 in the layer of insulating material 106 so as to expose sidewalls of the portions of the fins 105, followed by performing a second anisotropic etching process to remove the fins 105 to be removed that are exposed by the opening 113.

Recall that the layer of insulating material 112 was formed to a targeted thickness so that the dimension 114 (see FIG. 2J) was large enough to insure complete exposure of the adjacent fin 105 when the opening 113 is formed in the insulating material 106 as the insulating material 106 and the fins 105 are being removed concurrently (in one embodiment). Thus, unlike the prior art Fins-Cut-Last process, wherein an isotropic fin-removal etching process was necessary to insure complete removal of the fin, the fin-removal etching process disclosed herein is an anisotropic etching process. By performing the anisotropic fin-removal etching process, there is little to no undercutting (in the directions indicated by the arrows 115 in the plan view of FIG. 2L) of the remaining portions of the fins 105 positioned under the remaining hard mask line-type features 104A. That is, there is little to no undercutting of the fins 105 positioned under the remaining hard mask features 104A in the current transport direction of the completed devices. As mentioned above, the masking material portions 110 of the fin-removal masking layer protects the underlying layer of insulating material 106 during the fin removal etching process. Also note that, unlike the prior art Fins-cut-Last approach, the line-type features 104A of the fin-removal masking layer are exposed to the fin-removal etching process.

Figure 2M:
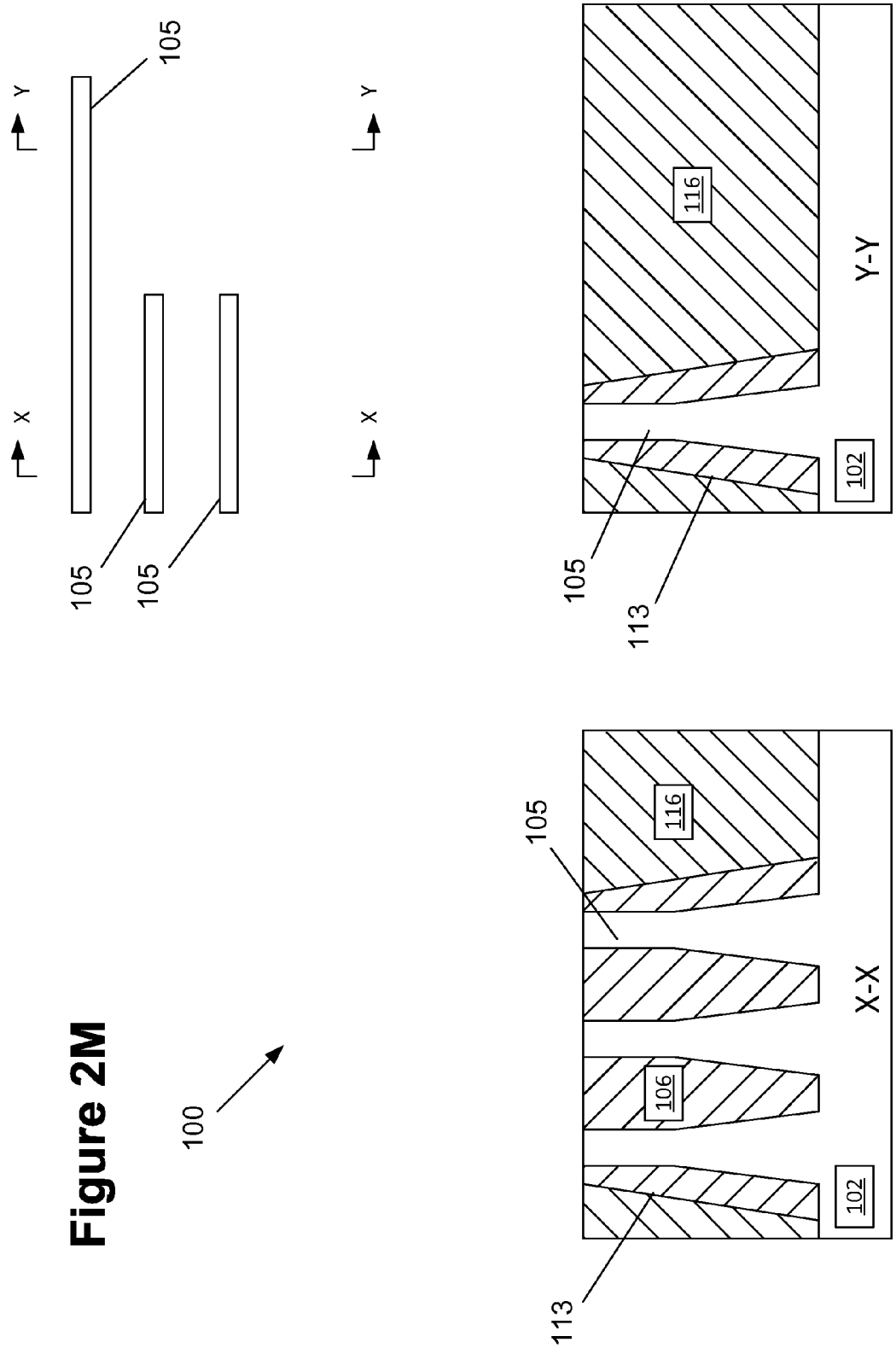

FIG. 2M depicts the device 100 after several process operations were performed. First, a layer of insulating material 116, such as silicon dioxide, was formed so as to overfill the openings 113. The insulating material 116 may be the same material as that of the insulating material 106, but a different cross-hatching is used so as to depict the separate formation of this additional insulating material 116. Thereafter, one or more chemical mechanical polishing (CMP) processes were performed to planarize the upper surface of the insulating materials 106/116 with the top of the remaining fins 105. These CMP processes also result in the removal of the remaining portions of the fin-removal masking layer. As depicted, the upper surfaces of the fins 105 are exposed when these process operations have been completed.

Figure 2N:
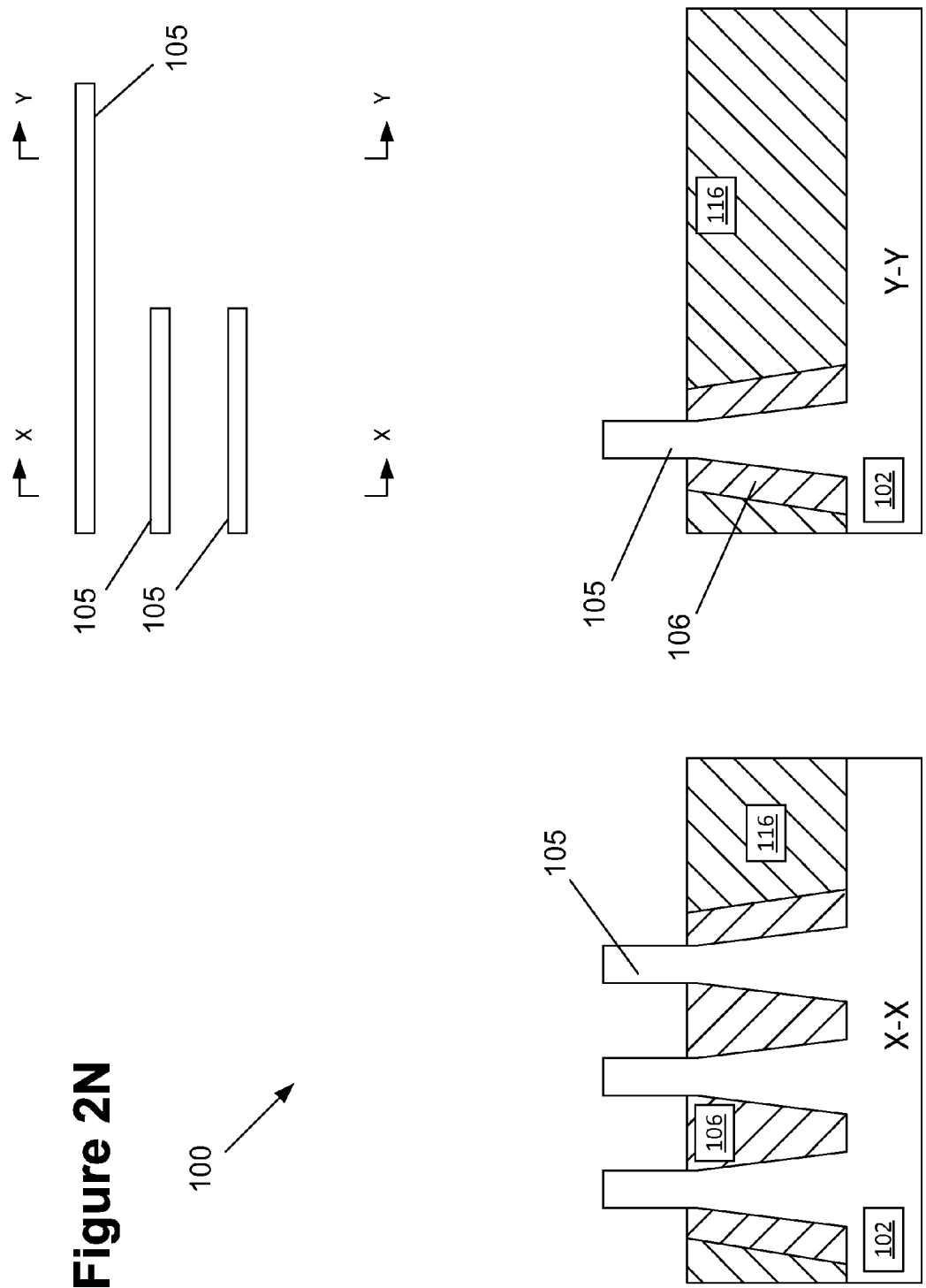

FIG. 2N depicts the device 100 after an etch-back process was performed to recess the layers of insulating materials 106/116 to the desired level between the fins 105 and thereby expose a desired amount of the fins 105, which corresponds to the final fin height for the fins of the device 100.

FIG. 2O depicts the device 100 after a plurality of gate structures were formed on the device. More specifically, a plurality of dummy gate structures 120 and first and second active gate structures 122, 124 are formed for the device 100. The active gate structure 122 is for a three-fin device of the tapered FinFET device 100, while the active gate structure 124 is for a single-fin device of the tapered FinFET device 100. Of course, the number of fins formed on the device 100 may vary depending upon the particular application. In general, the gate structures (both active and dummy) may be formed at the same time. The materials of construction may be different depending upon the type of device (N or P). The gate structures (both active and dummy) may be formed using either gate-first or gate-last manufacturing techniques. In the depicted example, the gate structures 122, 124 (and the dummy gates) include an illustrative gate insulation layer 130 and an illustrative gate electrode 132. The gate insulation layer 130 may be comprised of a variety of different materials, such as, for example, silicon dioxide, a so-called high-k (k greater than 10) insulation material (where k is the relative dielectric constant), etc. Similarly, the gate electrode 132 may also be of a material such as polysilicon or amorphous silicon, or it may be comprised of one or more metal layers that act as the gate electrode 132. As will be recognized by those skilled in the art after a complete reading of the present application, the gate structures 120, 122, 124 of the device 100 depicted in the drawings, i.e., the gate insulation layer 130 and the gate electrode 132, is intended to be representative in nature. That is, the gate structures may be comprised of a variety of different materials and they may have a variety of configurations.

FIG. 2P depicts an alternative process flow. In FIG. 2I, an isotropic etching process was performed to remove portions of the masking material layer 110. FIG. 2P depicts the situation where an anisotropic etching process was performed to remove portions of the masking material layer 110. This results in the formation of spacers 110X adjacent the features 104A of the patterned hard mask 104. Using this technique, the formation of the spacers 110X may be used to set the distance 114 (discussed above) so as to insure complete removal of the fin 105 adjacent the opening 113 in the layer of insulating material 106. In some cases, the formation of the spacers 110X may make the formation of the layer of material 112 unnecessary. After formation of the spacers 110X, the processing may continue as described above. In this example, the spacers 110X will also constitute part of the fin-removal masking layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a patterned fin-formation masking layer above a semiconductor substrate, said patterned fin-formation masking layer comprising a plurality of line-type features;
   performing at least one fin-formation etching process through said patterned fin-formation masking layer to thereby define a plurality of trenches in said substrate that define a plurality of fins, each fin being positioned under one of said line-type features of said patterned fin-formation masking layer;
   forming a layer of insulating material in said plurality of trenches;
   recessing said layer of insulating material so as to expose said line-type features of said patterned fin-formation masking layer;
   removing a portion of at least some of said line-type features of said patterned fin-formation masking layer so as to thereby expose an upper surface of portions of said fins underlying said removed portions of said line-type features and thereby define a modified patterned fin-formation masking layer that exposes said upper surfaces of said fins to be removed;

forming additional masking material at least between adjacent line-type features of said modified patterned fin-formation masking layer, wherein said modified patterned fin-formation masking layer and said additional masking material collectively constitute a fin-removal masking layer;

with said fin-removal masking layer in position above said substrate, performing an anisotropic etching process through said fin-removal masking layer to remove said fins to be removed and portions of said layer of insulating material concurrently during said anisotropic etching process;

removing said fin-removal masking layer; and recessing at least said layer of insulating material in said trenches, wherein said recessed layer of insulating material has a recessed surface that exposes a portion of said fins.

2. A method, comprising:

forming a patterned fin-formation masking layer above a semiconductor substrate, said patterned fin-formation masking layer comprising a plurality of line-type features;

performing at least one fin-formation etching process through said patterned fin-formation masking layer to thereby define a plurality of trenches in said semiconductor substrate that define a plurality of fin's, each comprising a first fin portion that will be removed and a second fin portion that will not be removed, wherein said first and second fin portions of each of said plurality of fins are positioned under respective first and second portions of one of said plurality of line-type features of said patterned fin-formation masking layer;

forming a layer of insulating material in said plurality of trenches;

recessing said layer of insulating material so as to expose said plurality of line-type features of said patterned fin-formation masking layer;

forming a fin-removal masking layer that exposes an upper surface of each of said first fin portions to be removed, wherein forming said fin-removal masking layer comprises:

modifying said patterned fin-formation masking layer by removing said first portions of each line-type feature of said patterned fin-formation masking layer so as to thereby expose said upper surfaces of said first fin portions to be removed; and forming a masking material at least between adjacent second portions of said plurality of line-type features of said modified patterned fin-formation masking layer, wherein said modified patterned fin-formation masking layer and said masking material collectively constitute said fin-removal masking layer; and with said fin-removal masking layer in position above said semiconductor substrate, performing at least one anisotropic etching process through said fin-removal masking layer to remove said first fin portions.

3. The method of claim 2, further comprising, prior to performing said at least one anisotropic etching process, forming a conformal layer of insulating material above said fin-removal masking layer.

4. The method of claim 3, wherein performing said at least one anisotropic etching process comprises removing horizontal portions of said conformal layer of insulating material so as to form, from said conformal layer of insulating material, a spacer adjacent to sidewalls of said fin-removal masking layer.

5. The method of claim 3, wherein forming said conformal layer of insulating material comprises forming said conformal layer of insulating material to a thickness such that a lateral distance between an edge of said conformal layer of insulating material and a nearest edge of a closest first fin portion to be removed is large enough such that, when said at least one anisotropic etching process is performed, all of the entire vertical height of said closest first fin portion will be removed.

6. The method of claim 3, wherein performing said at least one anisotropic etching process comprises performing said at least one anisotropic etching process such that said conformal layer of insulating material is consumed during said at least one anisotropic etching process.

7. The method of claim 2, wherein forming said masking material at least between said adjacent second portions of said plurality of line-type features of said modified patterned fin-formation masking layer comprises forming said masking material above said second portions of said plurality of line-type features of said modified patterned fin-formation masking layer and above all of said layer of insulating material positioned in said trenches.

8. The method of claim 7, further comprising performing a further anisotropic etching process on said masking material such that said masking material only remains positioned in said spaces defined between said adjacent second portions of said plurality of line-type features of said modified patterned fin-formation masking layer, above portions of said layer of insulating material formed in said plurality of trenches, and adjacent sidewalls of said second portions of said plurality of line-type features of said modified patterned fin-formation masking layer.

9. The method of claim 8, wherein performing said further anisotropic etching process on said masking material comprises performing said further anisotropic etching process on said masking material so as to form a sidewall spacer of said masking material to a thickness such that a lateral distance between an edge of said sidewall spacer and a nearest edge of a closest first fin portion to be removed is large enough such that, when said at least one anisotropic etching process is performed, all of the entire vertical height of said closest first fin portion to be removed will be removed.

10. The method of claim 7, further comprising performing an isotropic etching process on said masking material such that said masking material only remains positioned in said spaces defined between said adjacent second portions of said plurality of line-type features of said modified patterned fin-formation masking layer and above portions of said layer of insulating material formed in said plurality of trenches.

11. The method of claim 2, wherein performing said at least one anisotropic etching process comprises performing a single anisotropic etching process that is non-selective to said layer of insulating material formed in said plurality of trenches and a material of said first fin portions to be removed so as to concurrently remove portions of said layer of insulating material and said first fin portions to be removed during said single non-selective anisotropic etching process.

12. The method of claim 2, wherein performing said at least one anisotropic etching process comprises:

performing a first anisotropic etching process to form an opening in said layer of insulating material formed in said plurality of trenches so as to expose sidewalls of said first fin portions to be removed; and after forming said opening in said layer of insulating material, performing a second anisotropic etching process to remove said first fin portions of said fins to be removed.

13. The method of claim 2, wherein said fin-removal masking layer further comprises a spacer positioned adjacent sidewalls of some of said second portions of said plurality of line-type features, said spacer comprising said masking material.

14. The method of claim 2, wherein, during said at least one anisotropic etching process, said second portions of said plurality of line-type features of said fin-removal masking layer are exposed to said at least one anisotropic etching process.

15. The method of claim 2, wherein forming said layer of insulating material in said plurality of trenches comprises filling in each of said plurality of trenches with said insulating material, said insulating material covering sidewalls of each of said fins and sidewalls of each of said plurality of line-type features.

16. The method of claim 2, wherein removing said first portions of said plurality of line-type features of said patterned fin-formation masking layer comprises:
forming a patterned etch mask above said patterned fin-formation masking layer, said patterned etch mask exposing said first portions of said plurality of line-type features and covering said second portions of said plurality of line-type features;
performing an etching process through said patterned etch mask to remove said first portions of said plurality of line-type features of said patterned fin-formation masking layer so as to thereby expose said upper surfaces of said first fin portions of said plurality of fins; and
removing said patterned etch mask.

17. The method of claim 2, wherein said line-type features of said fin-removal masking layer comprise silicon nitride and said masking material comprises $Al_2O_3$.

18. The method of claim 2, further comprising removing said fin-removal masking layer and recessing at least said layer of insulating material formed in said plurality of trenches, wherein said recessed layer of insulating material has a recessed surface that exposes remaining second fin portions of said plurality of fins.

19. A method, comprising:
forming a patterned fin-formation masking layer above a semiconductor substrate, said patterned fin-formation masking layer comprising a plurality of line-type features;
performing at least one fin-formation etching process through said patterned fin-formation masking layer to thereby define a plurality of trenches in said semiconductor substrate that define a plurality of fin's, each comprising a first fin portion that will be removed and a second fin portion that will not be removed, wherein said first and second fin portions of each of said plurality of fins are positioned under respective first and second portions of one of said plurality of line-type features of said patterned fin-formation masking layer;
forming a layer of insulating material in said plurality of trenches;
recessing said layer of insulating material so as to expose said plurality of line-type features of said patterned fin-formation masking layer;
forming a fin-removal masking layer that exposes an upper surface of each of said first fin portions to be removed, wherein forming said fin-removal masking layer comprises:
modifying said patterned fin-formation masking layer by removing said first portions of each line-type feature of said patterned fin-formation masking layer so as to thereby expose said upper surfaces of said first fin portions to be removed; and
forming a masking material adjacent said second portions of said plurality of line-type features of said modified patterned fin-formation masking layer, wherein said modified patterned fin-formation masking layer and said masking material collectively constitute said fin-removal masking layer;
with said fin-removal masking layer in position above said semiconductor substrate, performing at least one anisotropic etching process through said fin-removal masking layer to remove said first fin portions;
removing said fin-removal masking layer; and
recessing at least said layer of insulating material in said trenches, wherein said recessed layer of insulating material has a recessed surface that exposes remaining second fin portions of said plurality of fins.

20. The method of claim 19, wherein forming said masking material adjacent said second portions of said plurality of line-type features of said modified patterned fin-formation masking layer and above said portions of said layer of insulating material formed in said trenches comprises forming a first portion of said masking material between adjacent second portions of said plurality of line-type features of said modified patterned fin-formation masking layer and forming a second portion of said masking material adjacent a sidewall of at least one of said second portions of said plurality of line-type features, wherein said second portion of said masking material comprises a sidewall spacer that is positioned on an opposite side of said at least one of said second portions of said plurality of line-type features from said first portion of said masking material.

21. The method of claim 20, wherein said sidewall spacer has a thickness such that a lateral distance between an edge of said sidewall spacer and a nearest edge of a closest first fin portion to be removed is large enough such that, when said at least one anisotropic etching process is performed, all of the entire vertical height of said closest first fin portion to be removed will be removed.

22. The method of claim 19, wherein performing said at least one anisotropic etching process comprises performing a single anisotropic etching process that is non-selective to said layer of insulating material formed in said plurality of trenches and a material of said first fin portions to be removed so as to concurrently remove portions of said layer of insulating material and said first fin portions to be removed during said single non-selective anisotropic etching process.

23. The method of claim 19, wherein performing said at least one anisotropic etching process comprises:
performing a first anisotropic etching process to form an opening in said layer of insulating material formed in said plurality of trenches so as to expose sidewalls of said first fin portions to be removed; and
after forming said opening in said layer of insulating material, performing a second anisotropic etching process to remove said first fin portions of said fins to be removed.

24. The method of claim 19, wherein said fin-removal masking layer comprises a spacer positioned adjacent sidewalls of some of said second portions of said plurality of line-type features, said spacer comprising said masking material.

25. The method of claim 19, wherein, during said at least one anisotropic etching process, said second portions of said plurality of line-type features of said fin-removal masking layer are exposed to said at least one anisotropic etching process.

26. The method of claim 19, wherein forming said layer of insulating material in said plurality of trenches comprises filling in each of said plurality of trenches with said insulating material, said insulating material covering sidewalls of each of said fins and sidewalls of each of said plurality of line-type features.

27. The method of claim 19, wherein forming said masking material adjacent said second portions of said plurality of line-type features of said modified patterned fin-formation masking layer comprises forming said masking material above said second portions of said plurality of line-type features of said modified patterned fin-formation masking layer and above all of said layer of insulating material positioned in said trenches.

28. The method of claim 19, wherein said line-type features of said fin-removal masking layer comprise silicon nitride and said masking material comprises $Al_2O_3$.

* * * * *

UNITED STATES PATENT AND TRADEMARK OFFICE
CERTIFICATE OF CORRECTION

PATENT NO. : 9,779,960 B2  
APPLICATION NO. : 14/726712  
DATED : October 3, 2017  
INVENTOR(S) : Ruilong Xie et al.

Page 1 of 1

It is certified that error appears in the above-identified patent and that said Letters Patent is hereby corrected as shown below:

Column 13, Line 30 (Claim 2, Line 9), change "fin's" to -- fins --.

Column 15, Line 52 (Claim 19, Line 9), change "fin's" to -- fins --.

Signed and Sealed this  
Fourteenth Day of November, 2017

Joseph Matal  
*Performing the Functions and Duties of the*  
*Under Secretary of Commerce for Intellectual Property and*  
*Director of the United States Patent and Trademark Office*